US012750620B2

(12) United States Patent
Wilberding et al.

(10) Patent No.: US 12,750,620 B2
(45) Date of Patent: Sep. 29, 2026

(54) DISTRIBUTED GENERATIVE MODELS

(71) Applicant: Sonos, Inc., Goleta, CA (US)

(72) Inventors: Dayn Wilberding, Portland, OR (US); Gregory McAllister, London (GB); Daniel Jones, London (GB)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 19/080,510

(22) Filed: Mar. 14, 2025

(65) Prior Publication Data

US 2025/0324198 A1 Oct. 16, 2025

Related U.S. Application Data

(63) Continuation of application No. 18/497,622, filed on Oct. 30, 2023, now abandoned, which is a continuation of application No. 17/302,690, filed on May 10, 2021, now Pat. No. 11,812,240.

(60) Provisional application No. 63/198,866, filed on Nov. 18, 2020.

(51) Int. Cl.

| | |
|---|---|
| ***H04R 3/12*** | (2006.01) |
| ***G06F 3/16*** | (2006.01) |
| ***H03G 1/02*** | (2006.01) |
| ***H04R 3/02*** | (2006.01) |

(Continued)

(52) U.S. Cl.

CPC ............... *H04R 3/12* (2013.01); *G06F 3/165* (2013.01); *H03G 1/02* (2013.01); *H04R 3/02* (2013.01); *H04R 27/00* (2013.01); *G06N 3/02* (2013.01); *H04R 2227/005* (2013.01); *H04R 2420/07* (2013.01)

(58) Field of Classification Search

CPC .......... G06N 3/02; G06F 3/165; H04R 27/00; H04R 227/005; H04R 2420/07; H04R 3/12

USPC ...................................................... 381/58–59

See application file for complete search history.

(56) References Cited

U.S. PATENT DOCUMENTS

| | | | | |
|---|---|---|---|---|
| 10,652,663 | B1 * | 5/2020 | Burenius | H04R 5/04 |
| 10,674,307 | B1 * | 6/2020 | Robinson | H04S 7/304 |
| 11,561,757 | B2 * | 1/2023 | Khaleghimeybodi | G06F 3/165 |

(Continued)

FOREIGN PATENT DOCUMENTS

| | | | |
|---|---|---|---|
| EP | 3981170 | A1 | 4/2022 |
| JP | 2015527768 | A | 9/2015 |

(Continued)

OTHER PUBLICATIONS

European Patent Office, European Office Action mailed on May 23, 2025, issued in connection with European Application No. 21827802.6, 15 pages.

(Continued)

*Primary Examiner* — Disler Paul

(74) *Attorney, Agent, or Firm* — Fortem IP LLP

(57) ABSTRACT

Generative media content (e.g., generative audio) can be played back across multiple playback devices concurrently. A generative content group coordinator device can receive input parameters, which can include sensor data, media content, or other such input. The coordinator device can generate first and second generative media content streams, each of which can be transmitted to first and second playback devices, respectively. The first and second playback devices can play back the first and second streams of generative media content concurrently.

35 Claims, 14 Drawing Sheets

(51) Int. Cl.
*H04R 27/00* (2006.01)
*G06N 3/02* (2006.01)

(56) References Cited

U.S. PATENT DOCUMENTS

| | | | | |
|---|---|---|---|---|
| 11,587,559 | B2 * | 2/2023 | Newendorp | G06F 13/14 |
| 11,653,167 | B2 * | 5/2023 | Cappello | H04S 7/303<br>381/303 |
| 12,327,133 | B1 * | 6/2025 | Mukesh | G06F 9/5083 |
| 2012/0284757 | A1 | 11/2012 | Rajapakse | |
| 2013/0331970 | A1 | 12/2013 | Beckhardt et al. | |
| 2015/0092947 | A1 | 4/2015 | Gossain et al. | |
| 2015/0120953 | A1 | 4/2015 | Crowe et al. | |
| 2017/0195980 | A1 * | 7/2017 | Aggarwal | H04W 56/005 |
| 2018/0020309 | A1 | 1/2018 | Banerjee et al. | |
| 2019/0289417 | A1 | 9/2019 | Tomlin et al. | |
| 2020/0073731 | A1 | 3/2020 | Fish et al. | |
| 2020/0280814 | A1 | 9/2020 | Taylor et al. | |
| 2021/0021953 | A1 | 1/2021 | Kim et al. | |
| 2021/0029453 | A1 | 1/2021 | Banerjee et al. | |
| 2022/0337969 | A1 | 10/2022 | Seefeldt et al. | |

FOREIGN PATENT DOCUMENTS

| | | | |
|---|---|---|---|
| JP | 2020091338 | A | 6/2020 |
| WO | 2013184792 | A1 | 12/2013 |
| WO | 2020068909 | A1 | 4/2020 |
| WO | 2020171996 | A1 | 8/2020 |

OTHER PUBLICATIONS

Final Office Action mailed on Sep. 8, 2025, issued in connection with U.S. Appl. No. 19/068,994, filed Mar. 3, 2025, 13 pages.

Final Office Action mailed on Dec. 17, 2024, issued in connection with U.S. Appl. No. 18/497,622, filed Oct. 30, 2023, 21 pages.

International Bureau, International Preliminary Report on Patentability and Written Opinion, mailed on Jun. 1, 2023, issued in connection with International Application No. PCT/US2021/072454, filed on Nov. 17, 2021, 12 pages.

International Bureau, International Search Report and Written Opinion mailed on May 16, 2022, issued in connection with International Application No. PCT/US2021/072454, filed on Nov. 17, 2021, 18 pages.

Japanese Patent Office, Decision of Grant a Patent and Translation mailed on Jul. 1, 2025, issued in connection with Japanese Patent Application No. 2023-530317, 5 pages.

Japanese Patent Office, Notice of Reasons for Refusal and Translation mailed on Mar. 18, 2025, issued in connection with Japanese Patent Application No. 2023-530317, 14 pages.

Japanese Patent Office, Notice of Reasons for Refusal and Translation mailed on Aug. 27, 2024, issued in connection with Japanese Patent Application No. 2023-530317, 17 pages.

Non-Final Office Action mailed on May 1, 2025, issued in connection with U.S. Appl. No. 19/068,994, filed Mar. 3, 2025, 12 pages.

Non-Final Office Action mailed on May 7, 2025, issued in connection with U.S. Appl. No. 18/680,441, filed May 31, 2024, 14 pages.

Non-Final Office Action mailed on Oct. 17, 2024, issued in connection with U.S. Appl. No. 18/615,546, filed Mar. 25, 2024, 07 pages.

Non-Final Office Action mailed on May 31, 2024, issued in connection with U.S. Appl. No. 18/497,622, filed Oct. 30, 2023, 21 pages.

Notice of Allowance mailed on Mar. 7, 2025, issued in connection with U.S. Appl. No. 18/615,546, filed Mar. 25, 2024, 9 pages.

Notice of Allowance mailed on Feb. 5, 2024, issued in connection with U.S. Appl. No. 18/181,727, filed Mar. 10, 2023, 9 pages.

*Sonos, Inc.* v. *D&M Holdings* (No. 14-1330-RGA), DI 219, Claim Construction Opinion (Jan. 12, 2017) (24 pages).

* cited by examiner

DISTRIBUTED GENERATIVE MODELS

CROSS-REFERENCE TO RELATED APPLICATIONS

The present application is a continuation of U.S. patent application Ser. No. 18/497,622, filed Oct. 30, 2023, now abandoned, which is a continuation of U.S. patent application Ser. No. 17/302,690, filed May 10, 2021, now U.S. Pat. No. 11,812,240, which claims the benefit of priority to U.S. Patent Application No. 63/198,866, filed Nov. 18, 2020, each of which is hereby incorporated by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

Figure 1A:
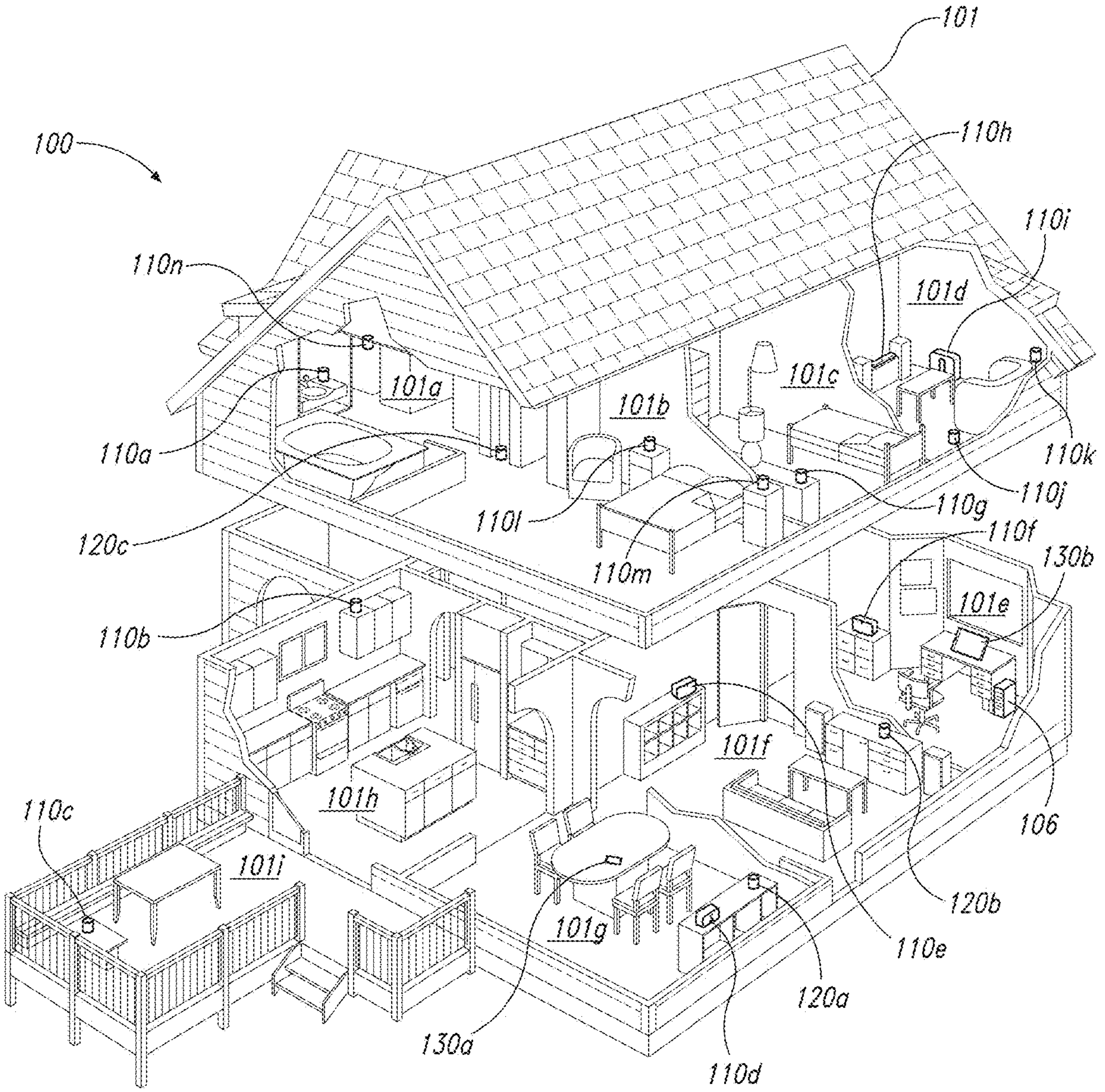
FIG. 1A is a partial cutaway view of an environment having a media playback system configured in accordance with aspects of the disclosed technology.

The drawings are for the purpose of illustrating examples of the present technology, but those of ordinary skill in the art will understand that the technology disclosed herein is not limited to the arrangements and/or instrumentality shown in the drawings.

DETAILED DESCRIPTION

I. Overview

Generative media content is content that is dynamically synthesized, created, and/or modified based on an algorithm, whether implemented in software or a physical model. The generative media content can change over time based on the algorithm alone or in conjunction with contextual data (e.g., user sensor data, environmental sensor data, occurrence data). In various examples, such generative media content can include generative audio (e.g., music, ambient soundscapes, etc.), generative visual imagery (e.g., abstract visual designs that dynamically change shape, color, etc.), or any other suitable media content or combination thereof. As explained elsewhere herein, generative audio can be created at least in part via an algorithm and/or non-human system that utilizes a rule-based calculation to produce novel audio content.

Because generative media content can be dynamically modified in real-time, it enables unique user experiences that are not available using conventional media playback of pre-recorded content. For example, generative audio can be endless and/or dynamic audio that is varied as inputs (e.g., input parameters associated with user input, sensor data, media source data, or any other suitable input data) to the algorithm change. In some examples, generative audio can be used to direct a user's mood toward a desired emotional state, with one or more characteristics of the generative audio varying in response to real-time measurements reflective of the user's emotional state. As used in examples of the present technology, the system can provide generative audio based on the current and/or desired emotional states of a user, based on a user's activity level, based on the number of users present within an environment, or any other suitable input parameter.

As another example, generative audio can be created and/or modified based on one or more inputs, such as a user's location, or activity, the number of users present in a room, time of day, or any other input (e.g., as determined by one or more sensors or by a user input). For example, when a single user is sitting at her desk in a calm state, the media playback system may automatically produce generative audio content suitable for focused study or work, whereas when multiple users are present in a room in an excited state with lots of movement, the same media playback system may automatically produce generative audio suitable for a social gathering or dance party. In various examples, audio characteristics that can be dynamically modified for producing generative audio can include selection of audio samples or clips, tempo, bass/treble/mid-range volume, spatial filtering of audio output, or any other suitable audio characteristics. The audio characteristics may be changed by using different tones or sounds, timing of the tones or sounds, and/or audio samples that may have the desired qualities. In some instances, characteristics may be changed by filtering or modulating playback of content as well, such as equalization, phase, or reverb/delay. During the listening experience, the audio characteristics of the generative music can be changed based on a number of inputs, such as time of day, geographic location, weather, or various user inputs, such as inferred mood, collective level of activity, or physiological inputs such as heart rate or the like.

In environments involving multiple discrete playback devices, it can be challenging to coordinate playback of generative audio content among the various playback devices. In some instances, each playback device can play back the same generative audio content in synchrony. To do so, the various devices may synchronize both their inputs or other parameters for the generative media content modules as well as synchronizing playback of the resulting generative audio. In some examples, some or all of the playback devices can have different playback responsibilities from one another (e.g., corresponding to different channels of audio input or other such division of playback responsibilities), while playback may still occur concurrently (e.g., synchronously) to be heard by one or more users in the environment. In some examples, different playback devices may play back completely separate generative audio content that nonetheless can be played back concurrently and/or synchronously. For example, within a room having a jungle-like visual décor, a first playback device may play back generative audio corresponding to flowing water sounds to simulate a stream, while a second playback device may play back generative audio corresponding to a bird song or other animal noises, while a third playback device may play back generative audio corresponding to rhythmic beats. Although each playback device outputs independent generative audio content, the user experience is nonetheless improved by all three devices playing back their respective generative audio content concurrently.

In these and other instances, it can be useful to coordinate playback among the various playback devices. In some examples, a generative media group can include a number of discrete devices that, in operation, play back generative audio content concurrently with one another. One device among the group can serve as a coordinator device, with the remaining group devices serving as member devices responsible for playback. In operation, the coordinator device can route media content, associated data, and/or instructions to the member devices to facilitate concurrent playback. In some examples, the coordinator device includes a generative media module that can produce one or more streams of generative audio content based on one or more inputs (e.g., sensor data, user inputs, selected audio content sources, etc.). The generative audio content streams can then be transmitted to the group member devices for playback. In some examples, the coordinator device can itself also be a member device, for example by participating in audio playback.

Additionally or alternatively, one or more of the member devices may utilize its own generative media module to dynamically produce generative audio content based on one or more input parameters. In such instances, the coordinator device can send instructions, data (e.g., timing data to facilitate synchronous playback), and/or input parameters to the member devices, which may then in turn produce generative audio for real-time or near-real-time playback concurrently with other devices in the group. Additional examples are explained in further detail below.

In some cases, processing input parameters and producing generative media content can be computationally intensive, and may exceed the computational capacities (e.g., processing power, available memory, etc.) of one or more local playback devices within an environment. Accordingly, it can be useful to utilize a distributed architecture for generative media playback, in which certain tasks required for producing generative media content are handled by remote computing devices (e.g., cloud-based servers), while other tasks are handled by one or more local playback devices. As one example, various permutations of generative media content can be produced and stored by one or more remote computing devices. These permutations may correspond to different energy levels, desired mood states, etc., and may be updated at the remote computing devices over time. A local playback device may then query the remote computing devices to receive a particular permutation of generative media content for playback. The particular permutation requested or delivered may be based, at least in part, on one or more input parameters, which may in turn be detected and/or provided by the playback device. In one example, a local playback device (or a plurality of such devices) may receive input parameters (e.g., sensor data) that indicate a large number of people in the room. These parameters can indicate a high energy level, and accordingly the local playback device can request an appropriate permutation of generative media content from the remote computing device(s). The remote computing device(s) can then select and transmit the appropriate permutation of generative media content to the local playback device for playback.

At the remote computing device(s), various permutations of the generative media content can be produced and stored, each having different characteristics and/or profiles. For example, a generative media module stored on the remote computing device(s) may utilize a particular generative media content model (e.g., an algorithm or set of rules that produce novel, generative media content using one or more audio segments and/or input parameters as inputs) to generate a plurality of different permutations of generative media content. For example, the generative media module may generate high-energy, medium-energy, and low-energy variations of the same generative media content, in which the same (or at least some overlapping) audio segments are used across the various permutations, but the segments are mixed and/or modified differently to produce different content (e.g., higher or lower tempo, more or fewer chord changes, etc.).

Additionally or alternatively, a number of discrete audio segments may be stored locally on one or more playback devices within the local environment. These audio segments can be arranged, ordered, overlapped, mixed, and/or otherwise processed for playback in a manner that produces generative media content. In some examples, the remote computing devices may periodically provide instructions to the local playback device in the form of an updated generative media content model (e.g., an algorithm), which the local playback device(s) may then use to play back the locally stored discrete audio segments in a manner that achieves the desired psychoacoustic effects. In this example, tasks required to output generative audio are distributed such that the local playback device(s) store, arrange, and play back the constituent audio segments while the remote computing device(s) process input parameters and determine how the particular segments should be arranged and otherwise processed to produce the desired generative media content. Various other distributions of tasks between local and remote computing devices are possible.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110*a* is first introduced and discussed with reference to FIG. 1A. Many of the details, dimensions, angles and other features shown in the Figures are merely illustrative of particular examples of the disclosed technology. Accordingly, other examples can have other details, dimensions, angles and features without departing from the spirit or scope of the disclosure. In addition, those of ordinary skill in the art will appreciate that further examples of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110*a-n*), one or more network microphone devices ("NMDs") 120 (identified individually as NMDs 120*a-c*), and one or more control devices 130 (identified individually as control devices 130*a* and 130*b*).

As used herein the term "playback device" can generally refer to a network device configured to receive, process, and/or output data of a media playback system. For example, a playback device can be a network device that receives and processes audio content. In some examples, a playback device includes one or more transducers or speakers powered by one or more amplifiers. In other examples, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some examples, an NMD is a stand-alone device configured primarily for audio detection. In other examples, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers or one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain examples, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some examples, for instance, the media playback system 100 is configured to play back audio from a first playback device (e.g., the playback device 110*a*) in synchrony with a second playback device (e.g., the playback device 110*b*). Interactions between the playback devices 110, NMDs 120, and/or control devices 130 of the media playback system 100 configured in accordance with the various examples of the disclosure are described in greater detail below with respect to FIGS. 1B-1H.

In the illustrated example of FIG. 1A, the environment 101 comprises a household having several rooms, spaces, and/or playback zones, including (clockwise from upper left) a master bathroom 101*a*, a master bedroom 101*b*, a second bedroom 101*c*, a family room or den 101*d*, an office 101*e*, a living room 101*f*, a dining room 101*g*, a kitchen 101*h*, and an outdoor patio 101*i*. While certain examples and examples are described below in the context of a home environment, the technologies described herein may be implemented in other types of environments. In some examples, for instance, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101*e*, master bathroom 101*a*, master bedroom 101*b*, the second bedroom 101*c*, kitchen 101*h*, dining room 101*g*, living room 101*f*, and/or the outdoor patio 101*i*. In some aspects, a single playback zone may include multiple rooms or spaces. In certain aspects, a single room or space may include multiple playback zones.

In the illustrated example of FIG. 1A, the master bathroom 101*a*, the second bedroom 101*c*, the office 101*e*, the living room 101*f*, the dining room 101*g*, the kitchen 101*h*, and the outdoor patio 101*i* each include one playback device 110, and the master bedroom 101*b* and the den 101*d* include a plurality of playback devices 110. In the master bedroom 101*b*, the playback devices 110*l* and 110*m* may be configured, for example, to play back audio content in synchrony as individual ones of playback devices 110, as a bonded playback zone, as a consolidated playback device, and/or any combination thereof. Similarly, in the den 101*d*, the playback devices 110*h-j* can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E.

In some aspects, one or more of the playback zones in the environment 101 may each be playing different audio content. For instance, a user may be grilling on the patio 101*i* and listening to hip hop music being played by the playback device 110*c* while another user is preparing food in the kitchen 101*h* and listening to classical music played by the playback device 110*b*. In another example, a playback zone may play the same audio content in synchrony with another playback zone. For instance, the user may be in the office 101*e* listening to the playback device 110*f* playing back the same hip hop music being played back by playback device 110*c* on the patio 101*i*. In some aspects, the playback devices 110*c* and 110*f* play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
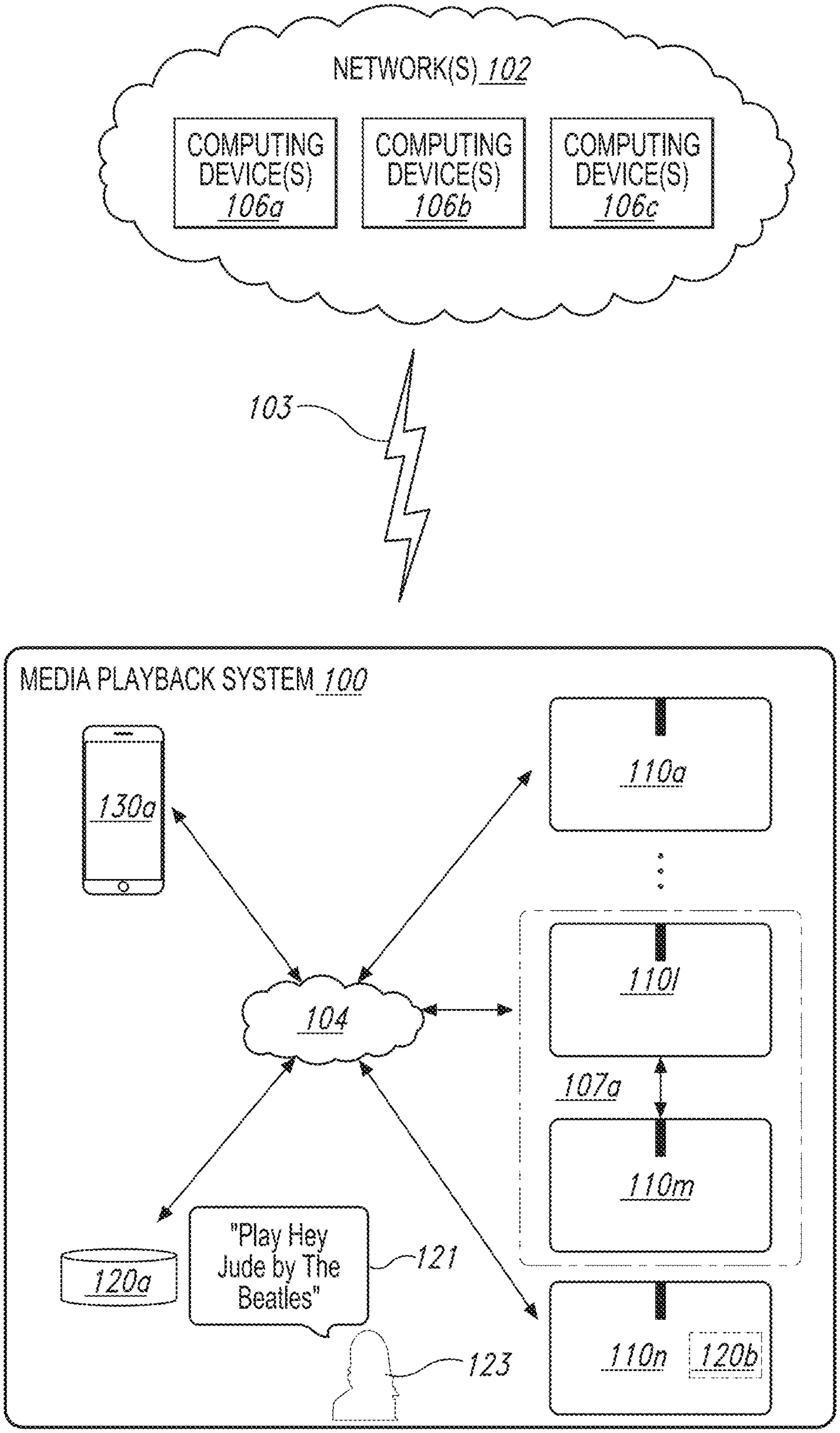
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some examples, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106*a*, a second computing device 106*b*, and a third computing device 106*c*). The computing devices 106 can comprise individual computers or servers, such as, for example, a media streaming service server storing audio and/or other media content, a voice service server, a social media server, a media playback system control server, etc. In some examples, one or more of the computing devices 106 comprise modules of a single computer or server. In certain examples, one or more of the computing devices 106 comprise one or more modules, computers, and/or servers. Moreover, while the cloud network 102 is described above in the context of a single cloud network, in some examples the cloud network 102 comprises a plurality of cloud networks comprising communicatively coupled computing devices. Furthermore, while the cloud network 102 is shown in FIG. 1B as having three of the computing devices 106, in some examples, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Moduleers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some examples, the network 104 comprises a dedicated communication network that the media playback system 100 uses to transmit messages between individual devices and/or to transmit media content to and from media content sources (e.g., one or more of the computing devices 106). In certain examples, the network 104 is configured to be accessible only to devices in the media playback system 100, thereby reducing interference and competition with other household devices. In other examples, however, the network 104 comprises an existing household communication network (e.g., a household WiFi network). In some examples, the links 103 and the network 104 comprise one or more of the same networks. In some aspects, for example, the links 103 and the network 104 comprise a telecommunication network (e.g., an LTE network, a 5G network). Moreover, in some examples, the media playback system 100 is implemented without the network 104, and devices comprising the media playback system 100 can communicate with each other, for example, via one or more direct connections, PANs, telecommunication networks, and/or other suitable communication links.

In some examples, audio content sources may be regularly added or removed from the media playback system 100. In some examples, for instance, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some examples, for instance, the media content database is stored on one or more of the playback devices 110, NMDs 120, and/or control devices 130.

In the illustrated example of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain examples, for instance, the group 107*a* comprises a bonded zone in which the playback devices 110*l* and 110*m* comprise left audio and right audio channels, respectively, of multi-channel audio content, thereby producing or enhancing a stereo effect of the audio content. In some examples, the group 107*a* includes additional playback devices 110. In other examples, however, the media playback system 100 omits the group 107*a* and/or other grouped arrangements of the playback devices 110.

The media playback system 100 includes the NMDs 120*a* and 120*d*, each comprising one or more microphones configured to receive voice utterances from a user. In the illustrated example of FIG. 1B, the NMD 120*a* is a standalone device and the NMD 120*d* is integrated into the playback device 110*n*. The NMD 120*a*, for example, is configured to receive voice input 121 from a user 123. In some examples, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
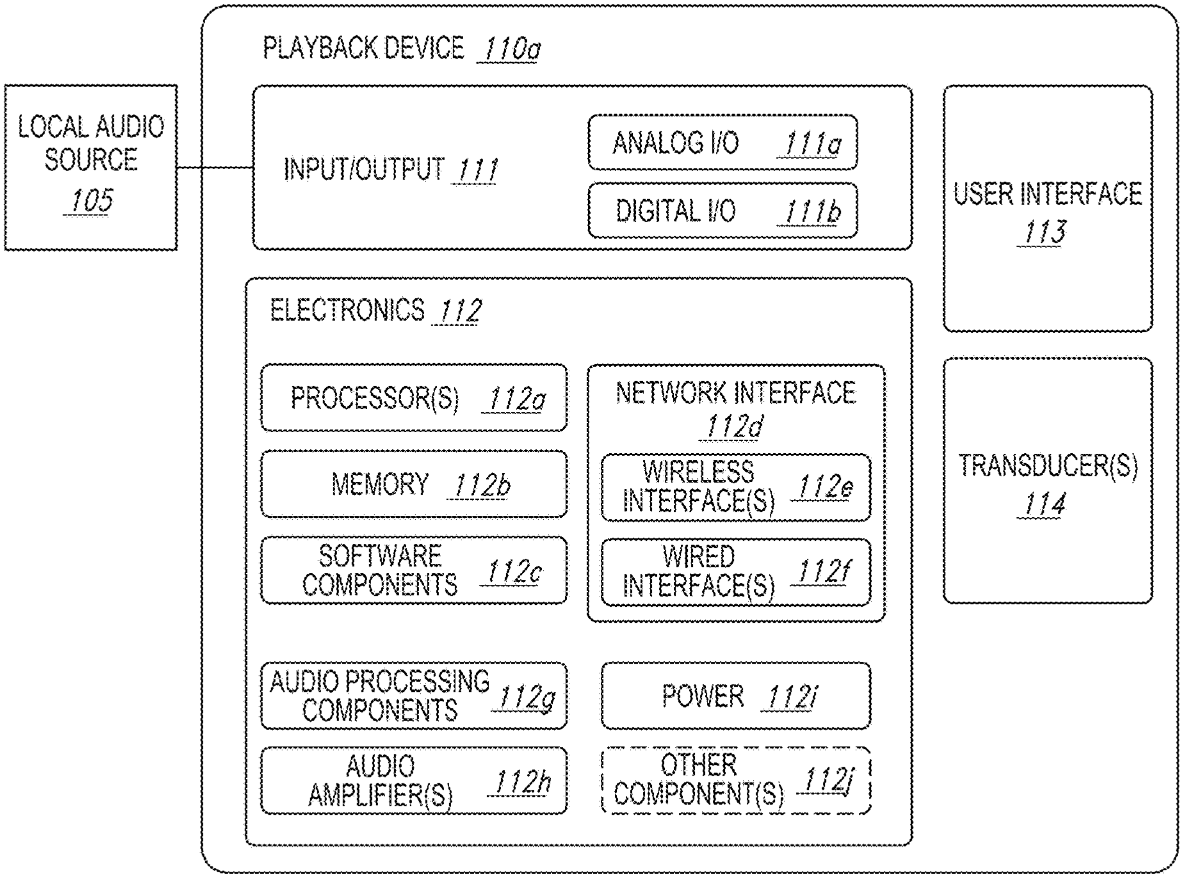
FIG. 1C is a block diagram of a playback device.

FIG. 1C is a block diagram of the playback device 110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some examples, the analog I/O 111*a* is an audio line-in input connection comprising, for example, an auto-detecting 3.5 mm audio line-in connection. In some examples, the digital I/O 111*b* comprises a Sony/Philips Digital Interface Format (S/PDIF) communication interface and/or cable and/or a Toshiba Link (TOSLINK) cable. In some examples, the digital I/O 111*b* comprises a High-Definition Multimedia Interface (HDMI) interface and/or cable. In some examples, the digital I/O 111*b* includes one or more wireless communication links comprising, for example, a radio frequency (RF), infrared, WiFi, Bluetooth, or another suitable communication protocol. In certain examples, the analog I/O 111*a* and the digital 111*b* comprise interfaces (e.g., ports, plugs, jacks) configured to receive connectors of cables transmitting analog and digital signals, respectively, without necessarily including cables.

The playback device 110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain examples, one or more of the playback devices 110, NMDs 120, and/or control devices 130 comprise the local audio source 105. In other examples, however, the media playback system omits the local audio source 105 altogether. In some examples, the playback device 110*a* does not include an input/output 111 and receives all audio content via the network 104.

The playback device 110*a* further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106*a-c* via the network 104 (FIG. 1B)), amplify the received audio, and output the amplified audio for playback via one or more of the transducers 114. In some examples, the playback device 110*a* optionally includes one or more microphones 115 (e.g., a single microphone, a plurality of microphones, a microphone array) (hereinafter referred to as "the microphones 115"). In certain examples, for instance, the playback device 110*a* having one or more of the optional microphones 115 can operate as an NMD configured to receive voice input from a user and correspondingly perform one or more operations based on the received voice input.

In the illustrated example of FIG. 1C, the electronics 112 comprise one or more processors 112*a* (referred to hereinafter as "the processors 112*a*"), memory 112*b*, software components 112*c*, a network interface 112*d*, one or more audio processing components 112*g* (referred to hereinafter as "the audio components 112*g*"), one or more audio amplifiers 112*h* (referred to hereinafter as "the amplifiers 112*h*"), and power 112*i* (e.g., one or more power supplies, power cables, power receptacles, batteries, induction coils, Power-over Ethernet (POE) interfaces, and/or other suitable sources of electric power). In some examples, the electronics 112 optionally include one or more other components 112*j* (e.g., one or more sensors, video displays, touchscreens, battery charging bases).

The processors 112*a* can comprise clock-driven computing component(s) configured to process data, and the memory 112*b* can comprise a computer-readable medium (e.g., a tangible, non-transitory computer-readable medium, data storage loaded with one or more of the software components 112*c*) configured to store instructions for performing various operations and/or functions. The processors 112*a* are configured to execute the instructions stored on the memory 112*b* to perform one or more of the operations. The operations can include, for example, causing the playback device 110*a* to retrieve audio data from an audio source (e.g., one or more of the computing devices 106*a-c* (FIG. 1B)), and/or another one of the playback devices 110. In some examples, the operations further include causing the playback device 110*a* to send audio data to another one of the playback devices 110*a* and/or another device (e.g., one of the NMDs 120). Certain examples include operations causing the playback device 110*a* to pair with another of the one or more playback devices 110 to enable a multi-channel audio environment (e.g., a stereo pair, a bonded zone).

The processors 112*a* can be further configured to perform operations causing the playback device 110*a* to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110*a* and the other one or more other playback devices 110. Additional details regarding audio playback synchronization among playback devices can be found, for example, in U.S. Pat. No. 8,234,395, which was incorporated by reference above.

In some examples, the memory 112*b* is further configured to store data associated with the playback device 110*a*, such as one or more zones and/or zone groups of which the playback device 110*a* is a member, audio sources accessible to the playback device 110*a*, and/or a playback queue that the playback device 110*a* (and/or another of the one or more playback devices) can be associated with. The stored data can comprise one or more state variables that are periodically updated and used to describe a state of the playback device 110*a*. The memory 112*b* can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112*d* is configured to facilitate a transmission of data between the playback device 110*a* and one or more other devices on a data network such as, for example, the links 103 and/or the network 104 (FIG. 1B). The network interface 112*d* is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112*d* can parse the digital packet data such that the electronics 112 properly receives and processes the data destined for the playback device 110*a*.

In the illustrated example of FIG. 1C, the network interface 112*d* comprises one or more wireless interfaces 112*e* (referred to hereinafter as "the wireless interface 112*e*"). The wireless interface 112*e* (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some examples, the network interface 112*d* optionally includes a wired interface 112*f* (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain examples, the network interface 112*d* includes the wired interface 112*f* and excludes the wireless interface 112*e*. In some examples, the electronics 112 excludes the network interface 112*d* altogether and transmits and receives media content and/or other data via another communication path (e.g., the input/output 111).

The audio components 112*g* are configured to process and/or filter data comprising media content received by the electronics 112 (e.g., via the input/output 111 and/or the network interface 112*d*) to produce output audio signals. In some examples, the audio processing components 112*g* comprise, for example, one or more digital-to-analog converters (DAC), audio preprocessing components, audio enhancement components, a digital signal processors (DSPs), and/or other suitable audio processing components, modules, circuits, etc. In certain examples, one or more of the audio processing components 112*g* can comprise one or more subcomponents of the processors 112*a*. In some examples, the electronics 112 omits the audio processing components 112*g*. In some aspects, for example, the processors 112*a* execute instructions stored on the memory 112*b* to perform audio processing operations to produce the output audio signals.

The amplifiers 112*h* are configured to receive and amplify the audio output signals produced by the audio processing components 112*g* and/or the processors 112*a*. The amplifiers 112*h* can comprise electronic devices and/or components configured to amplify audio signals to levels sufficient for driving one or more of the transducers 114. In some examples, for instance, the amplifiers 112*h* include one or more switching or class-D power amplifiers. In other examples, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain examples, the amplifiers 112*h* comprise a suitable combination of two or more of the foregoing types of power amplifiers. Moreover, in some examples, individual ones of the amplifiers 112*h* correspond to individual ones of the transducers 114. In other examples, however, the electronics 112 includes a single one of the amplifiers 112*h* configured to output amplified audio signals to a plurality of the transducers 114. In some other examples, the electronics 112 omits the amplifiers 112*h*.

The transducers 114 (e.g., one or more speakers and/or speaker drivers) receive the amplified audio signals from the amplifier 112*h* and render or output the amplified audio signals as sound (e.g., audible sound waves having a frequency between about 20 Hertz (Hz) and 20 kilohertz (kHz)). In some examples, the transducers 114 can comprise a single transducer. In other examples, however, the transducers 114 comprise a plurality of audio transducers. In some examples, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain examples, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
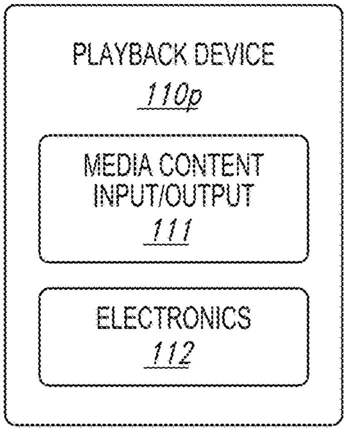
FIG. 1D is a block diagram of a playback device.

By way of illustration, SONOS, Inc. presently offers (or has offered) for sale certain playback devices including, for example, a "SONOS ONE," "PLAY:1," "PLAY:3," "PLAY:5," "PLAYBAR," "PLAYBASE," "CONNECT: AMP," "CONNECT," and "SUB." Other suitable playback devices may additionally or alternatively be used to implement the playback devices of example examples disclosed herein. Additionally, one of ordinary skilled in the art will appreciate that a playback device is not limited to the examples described herein or to SONOS product offerings. In some examples, for instance, one or more playback devices 110 comprises wired or wireless headphones (e.g., over-the-ear headphones, on-ear headphones, in-ear earphones). In other examples, one or more of the playback devices 110 comprise a docking station and/or an interface configured to interact with a docking station for personal mobile media playback devices. In certain examples, a playback device may be integral to another device or component such as a television, a lighting fixture, or some other device for indoor or outdoor use. In some examples, a playback device omits a user interface and/or one or more transducers. For example, FIG. 1D is a block diagram of a playback device 110*p* comprising the input/output 111 and electronics 112 without the user interface 113 or transducers 114.

Figure 1E:
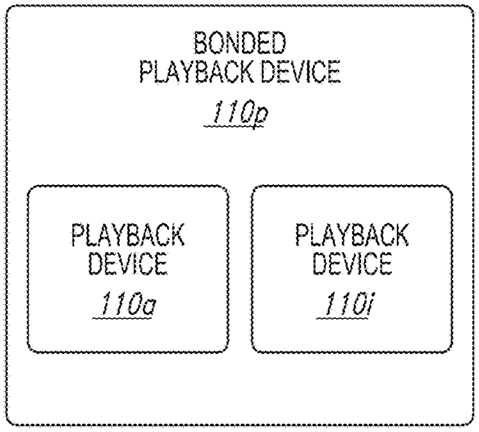
FIG. 1E is a block diagram of a bonded playback device.

FIG. 1E is a block diagram of a bonded playback device 110*q* comprising the playback device 110*a* (FIG. 1C) sonically bonded with the playback device 110*i* (e.g., a subwoofer) (FIG. 1A). In the illustrated example, the playback devices 110*a* and 110*i* are separate ones of the playback devices 110 housed in separate enclosures. In some examples, however, the bonded playback device 110*q* comprises a single enclosure housing both the playback devices 110*a* and 110*i*. The bonded playback device 110*q* can be configured to process and reproduce sound differently than an unbonded playback device (e.g., the playback device 110*a* of FIG. 1C) and/or paired or bonded playback devices (e.g., the playback devices 110*l* and 110*m* of FIG. 1B). In some examples, for instance, the playback device 110*a* is full-range playback device configured to render low frequency, mid-range frequency, and high frequency audio content, and the playback device 110*i* is a subwoofer configured to render low frequency audio content. In some aspects, the playback device 110*a*, when bonded with the first playback device, is configured to render only the mid-range and high frequency components of a particular audio content, while the playback device 110*i* renders the low frequency component of the particular audio content. In some examples, the bonded playback device 110*q* includes additional playback devices and/or another bonded playback device.

c. Suitable Network Microphone Devices (NMDs)

Figure 1F:
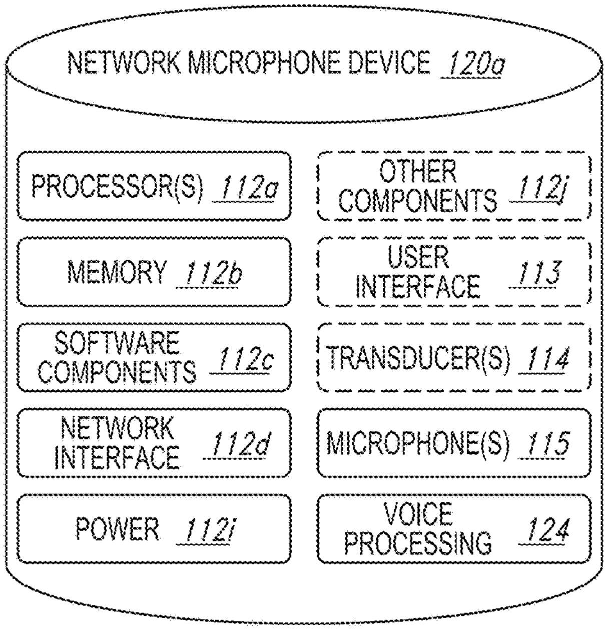
FIG. 1F is a block diagram of a network microphone device.

FIG. 1F is a block diagram of the NMD 120*a* (FIGS. 1A and 1B). The NMD 120*a* includes one or more voice processing components 124 (hereinafter "the voice components 124") and several components described with respect to the playback device 110*a* (FIG. 1C) including the processors 112*a*, the memory 112*b*, and the microphones 115. The NMD 120*a* optionally comprises other components also included in the playback device 110*a* (FIG. 1C), such as the user interface 113 and/or the transducers 114. In some examples, the NMD 120*a* is configured as a media playback device (e.g., one or more of the playback devices 110), and further includes, for example, one or more of the audio components 112*g* (FIG. 1C), the amplifiers 114, and/or other playback device components. In certain examples, the NMD 120*a* comprises an Internet of Things (IoT) device such as, for example, a thermostat, alarm panel, fire and/or smoke detector, etc. In some examples, the NMD 120*a* comprises the microphones 115, the voice processing 124, and only a portion of the components of the electronics 112 described above with respect to FIG. 1B. In some aspects, for example, the NMD 120*a* includes the processor 112*a* and the memory 112*b* (FIG. 1B), while omitting one or more other components of the electronics 112. In some examples, the NMD 120*a* includes additional components (e.g., one or more sensors, cameras, thermometers, barometers, hygrometers).

Figure 1G:
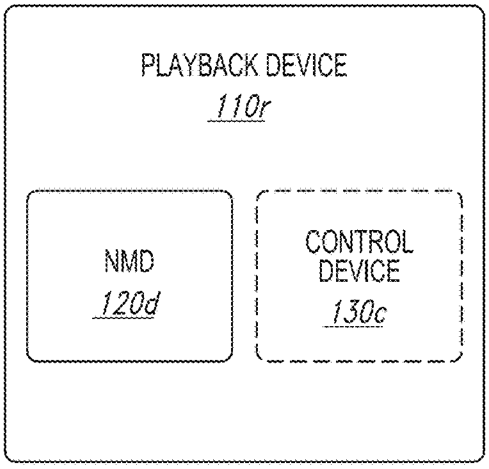
FIG. 1G is a block diagram of a playback device.

In some examples, an NMD can be integrated into a playback device. FIG. 1G is a block diagram of a playback device 110*r* comprising an NMD 120*d*. The playback device 110*r* can comprise many or all of the components of the playback device 110*a* and further include the microphones 115 and voice processing 124 (FIG. 1F). The playback device 110*r* optionally includes an integrated control device 130*c*. The control device 130*c* can comprise, for example, a user interface (e.g., the user interface 113 of FIG. 1B) configured to receive user input (e.g., touch input, voice input) without a separate control device. In other examples, however, the playback device 110*r* receives commands from another control device (e.g., the control device 130*a* of FIG. 1B).

Referring again to FIG. 1F, the microphones 115 are configured to acquire, capture, and/or receive sound from an environment (e.g., the environment 101 of FIG. 1A) and/or a room in which the NMD 120*a* is positioned. The received sound can include, for example, vocal utterances, audio played back by the NMD 120*a* and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

Figure 1H:
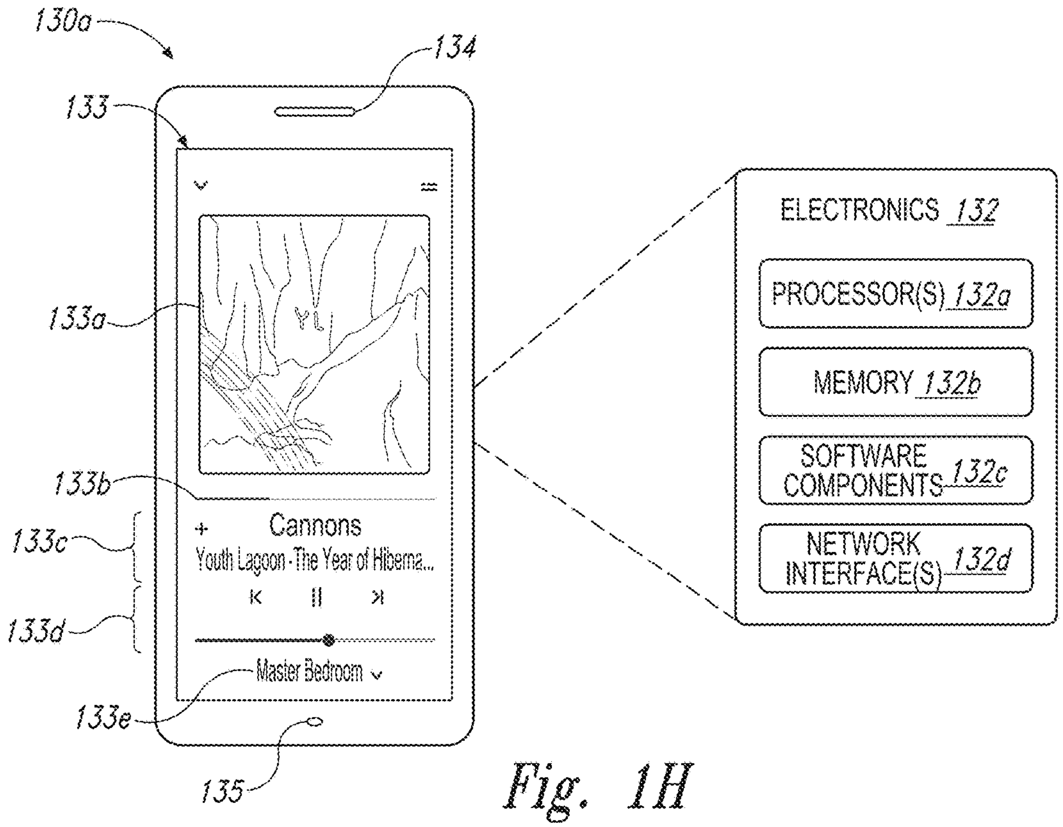
FIG. 1H is a partially schematic diagram of a control device.
Figure 1I:
FIGS. 1I through 1L show schematic diagrams of corresponding media playback system zones.

FIG. 1H is a partially schematic diagram of the control device 130*a* (FIGS. 1A and 1B). As used herein, the term "control device" can be used interchangeably with "controller" or "control system." Among other features, the control device 130*a* is configured to receive user input related to the media playback system 100 and, in response, cause one or more devices in the media playback system 100 to perform an action(s) or operation(s) corresponding to the user input. In the illustrated example, the control device 130*a* comprises a smartphone (e.g., an iPhone™, an Android phone) on which media playback system controller application software is installed. In some examples, the control device 130*a* comprises, for example, a tablet (e.g., an iPad™), a computer (e.g., a laptop computer, a desktop computer), and/or another suitable device (e.g., a television, an automobile audio head unit, an IoT device). In certain examples, the control device 130*a* comprises a dedicated controller for the media playback system 100. In other examples, as described above with respect to FIG. 1G, the control device 130*a* is integrated into another device in the media playback system 100 (e.g., one more of the playback devices 110, NMDs 120, and/or other suitable devices configured to communicate over a network).

The control device 130*a* includes electronics 132, a user interface 133, one or more speakers 134, and one or more microphones 135. The electronics 132 comprise one or more processors 132*a* (referred to hereinafter as "the processors 132*a*"), a memory 132*b*, software components 132*c*, and a network interface 132*d*. The processor 132*a* can be configured to perform functions relevant to facilitating user access, control, and configuration of the media playback system 100. The memory 132*b* can comprise data storage that can be loaded with one or more of the software components executable by the processor 112*a* to perform those functions. The software components 132*c* can comprise applications and/or other executable software configured to facilitate control of the media playback system 100. The memory 112*b* can be configured to store, for example, the software components 132*c*, media playback system controller application software, and/or other data associated with the media playback system 100 and the user.

The network interface 132*d* is configured to facilitate network communications between the control device 130*a* and one or more other devices in the media playback system 100, and/or one or more remote devices. In some examples, the network interface 132*d* is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132*d* can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132*d* can transmit a playback device control command (e.g., volume control, audio playback control, audio content selection) from the control device 130 to one or more of the playback devices 110. The network interface 132*d* can also transmit and/or receive configuration changes such as, for example, adding/removing one or more playback devices 110 to/from a zone, adding/removing one or more zones to/from a zone group, forming a bonded or consolidated player, separating one or more playback devices from a bonded or consolidated player, among others. Additional description of zones and groups can be found below with respect to FIGS. 1I through 1M.

The user interface 133 is configured to receive user input and can facilitate 'control of the media playback system 100. The user interface 133 includes media content art 133*a* (e.g., album art, lyrics, videos), a playback status indicator 133*b* (e.g., an elapsed and/or remaining time indicator), media content information region 133*c*, a playback control region 133*d*, and a zone indicator 133*e*. The media content information region 133*c* can include a display of relevant information (e.g., title, artist, album, genre, release year) about media content currently playing and/or media content in a queue or playlist. The playback control region 133*d* can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133*d* may also include selectable icons to modify equalization settings, playback volume, and/or other suitable playback actions. In the illustrated example, the user interface 133 comprises a display presented on a touch screen interface of a smartphone (e.g., an iPhone™, an Android phone). In some examples, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130*a*. In some examples, the one or more speakers comprise individual transducers configured to correspondingly output low frequencies, mid-range frequencies, and/or high frequencies. In some aspects, for example, the control device 130*a* is configured as a playback device (e.g., one of the playback devices 110). Similarly, in some examples the control device 130*a* is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some examples, two or more of the microphones 135 are arranged to capture location information of an audio source (e.g., voice, audible sound) and/or configured to facilitate filtering of background noise. Moreover, in certain examples, the control device 130*a* is configured to operate as playback device and an NMD. In other examples, however, the control device 130*a* omits the one or more speakers 134 and/or the one or more microphones 135. For instance, the control device 130*a* may comprise a device (e.g., a thermostat, an IoT device, a network device) comprising a portion of the electronics 132 and the user interface 133 (e.g., a touch screen) without any speakers or microphones.

Suitable Playback Device Configurations

Figure 1J:
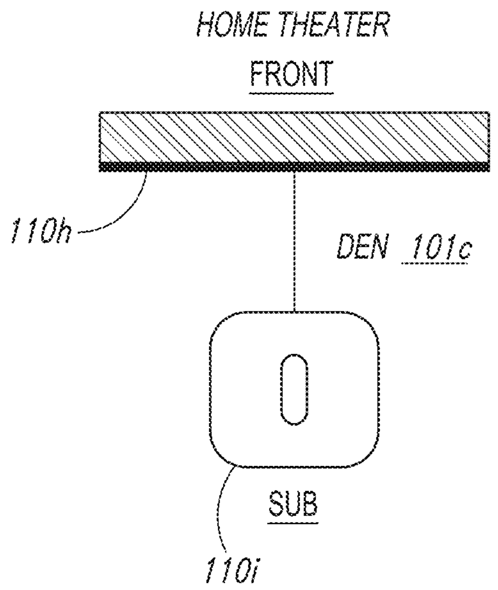
Figure 1K:
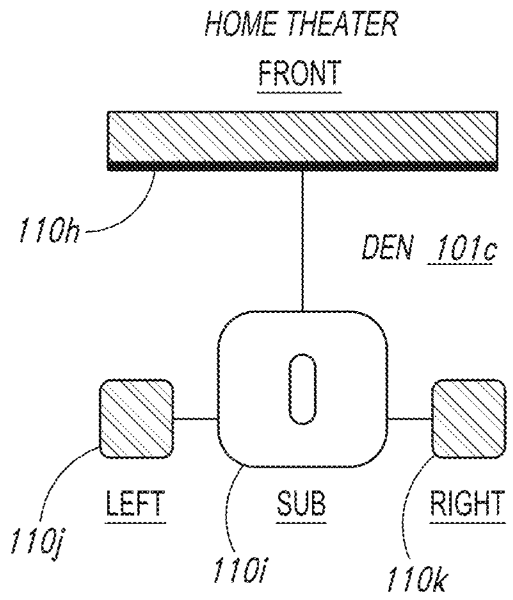
Figure 1L:
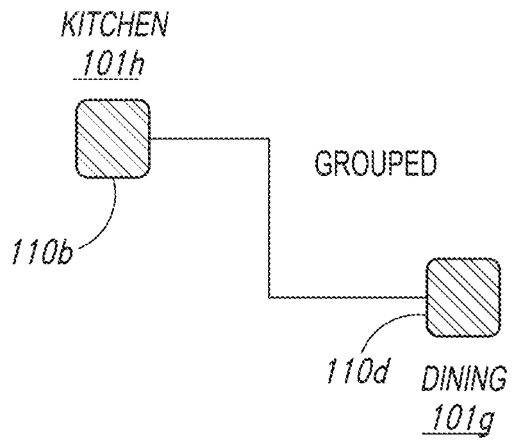
Figure 1M:
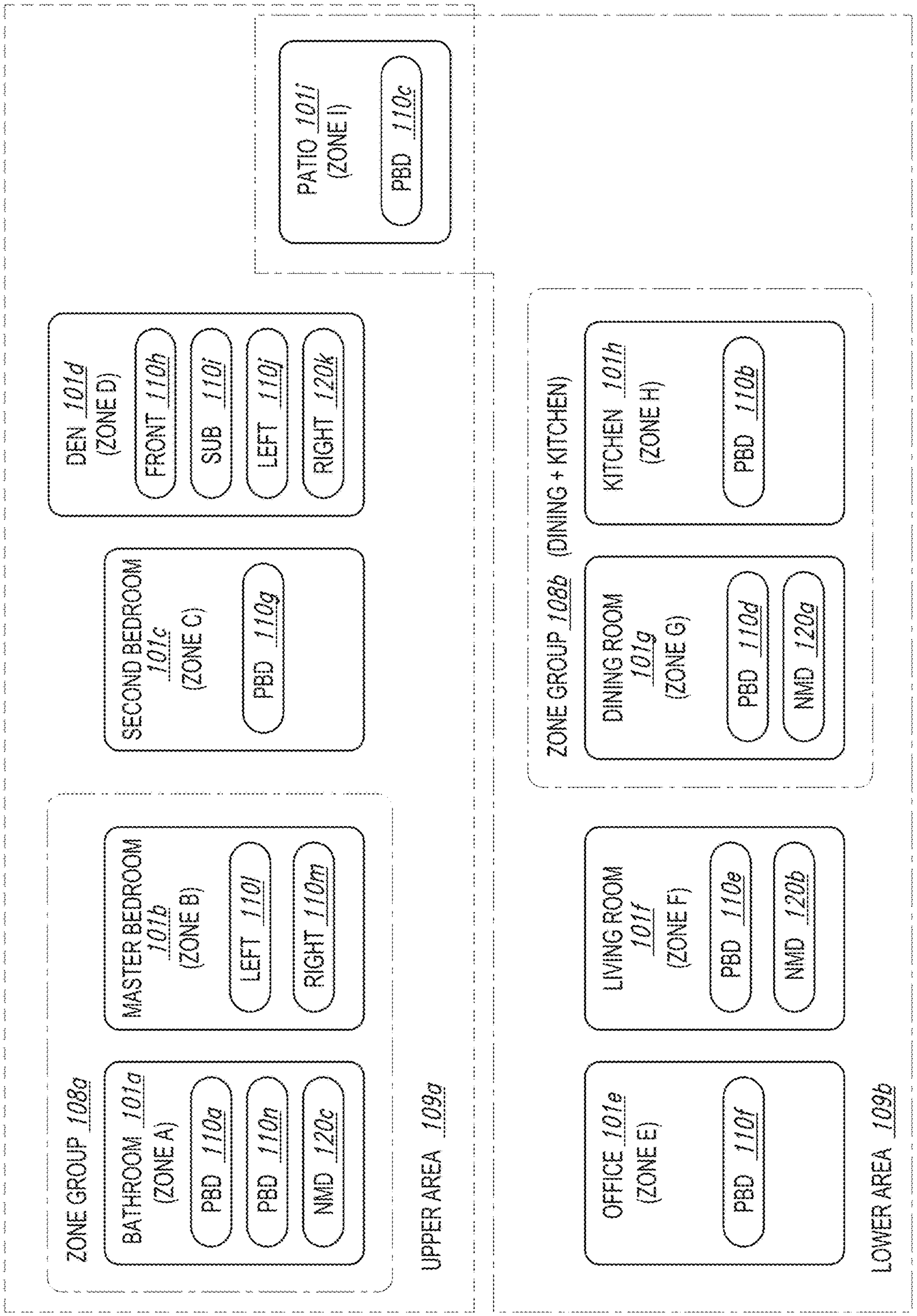
FIG. 1M shows a schematic diagram of media playback system areas.

FIGS. 1I through 1M show example configurations of playback devices in zones and zone groups. Referring first to FIG. 1M, in one example, a single playback device may belong to a zone. For example, the playback device 110*g* in the second bedroom 101*c* (FIG. 1A) may belong to Zone C. In some implementations described below, multiple playback devices may be "bonded" to form a "bonded pair" which together form a single zone. For example, the playback device 110*l* (e.g., a left playback device) can be bonded to the playback device 110*l* (e.g., a left playback device) to form Zone A. Bonded playback devices may have different playback responsibilities (e.g., channel responsibilities). In another implementation described below, multiple playback devices may be merged to form a single zone. For example, the playback device 110*h* (e.g., a front playback device) may be merged with the playback device 110*i* (e.g., a subwoofer), and the playback devices 110*j* and 110*k* (e.g., left and right surround speakers, respectively) to form a single Zone D. In another example, the playback devices 110*g* and 110*h* can be merged to form a merged group or a zone group 108*b*. The merged playback devices 110*g* and 110*h* may not be specifically assigned different playback responsibilities. That is, the merged playback devices 110*h* and 110*i* may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1-I, the playback devices 110*l* and 110*m* may be bonded so as to produce or enhance a stereo effect of audio content. In this example, the playback device 110*l* may be configured to play a left channel audio component, while the playback device 110*k* may be configured to play a right channel audio component. In some implementations, such stereo bonding may be referred to as "pairing."

Additionally, bonded playback devices may have additional and/or different respective speaker drivers. As shown in FIG. 1J, the playback device 110*h* named Front may be bonded with the playback device 110*i* named SUB. The Front device 110*h* can be configured to render a range of mid to high frequencies and the SUB device 110*i* can be configured render low frequencies. When unbonded, however, the Front device 110*h* can be configured render a full range of frequencies. As another example, FIG. 1K shows the Front and SUB devices 110*h* and 110*i* further bonded with Left and Right playback devices 110*j* and 110*k*, respectively. In some implementations, the Right and Left devices 110*j* and 102*k* can be configured to form surround or "satellite" channels of a home theater system. The bonded playback devices 110*h*, 110*i*, 110*j*, and 110*k* may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110*a* and 110*n* the master bathroom have the single UI entity of Zone A. In one example, the playback devices 110*a* and 110*n* may each output the full range of audio content each respective playback devices 110*a* and 110*n* are capable of, in synchrony.

In some examples, an NMD is bonded or merged with another device so as to form a zone. For example, the NMD 120*b* may be bonded with the playback device 110*e*, which together form Zone F, named Living Room. In other examples, a stand-alone network microphone device may be in a zone by itself. In other examples, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108*a* that includes the two zones. Similarly, Zone G may be grouped with Zone H to form the zone group 108*b*. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234,395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108*b* can have be assigned a name such as "Dining+Kitchen", as shown in FIG. 1M. In some examples, a zone group may be given a unique name selected by a user.

Certain data may be stored in a memory of a playback device (e.g., the memory 112*b* of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some examples, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101*c* may indicate that the playback device is the only playback device of the Zone C and not in a zone group. Identifiers associated with the Den may indicate that the Den is not grouped with other zones but includes bonded playback devices 110*h*-110*k*. Identifiers associated with the Dining Room may indicate that the Dining Room is part of the Dining+Kitchen zone group 108*b* and that devices 110*b* and 110*d* are grouped (FIG. 1L). Identifiers associated with the Kitchen may indicate the same or similar information by virtue of the Kitchen being part of the Dining+Kitchen zone group 108*b*. Other example zone variables and identifiers are described below.

In yet another example, the media playback system 100 may variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109*a* including Zones A-D, and a Lower Area 109*b* including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. application Ser. No. 15/682,506 filed Aug. 21, 2017 and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some examples, the media playback system 100 may not implement Areas, in which case the system may not store variables associated with Areas.

III. Multi-Device Playback of Generative Media Content

Figure 2:
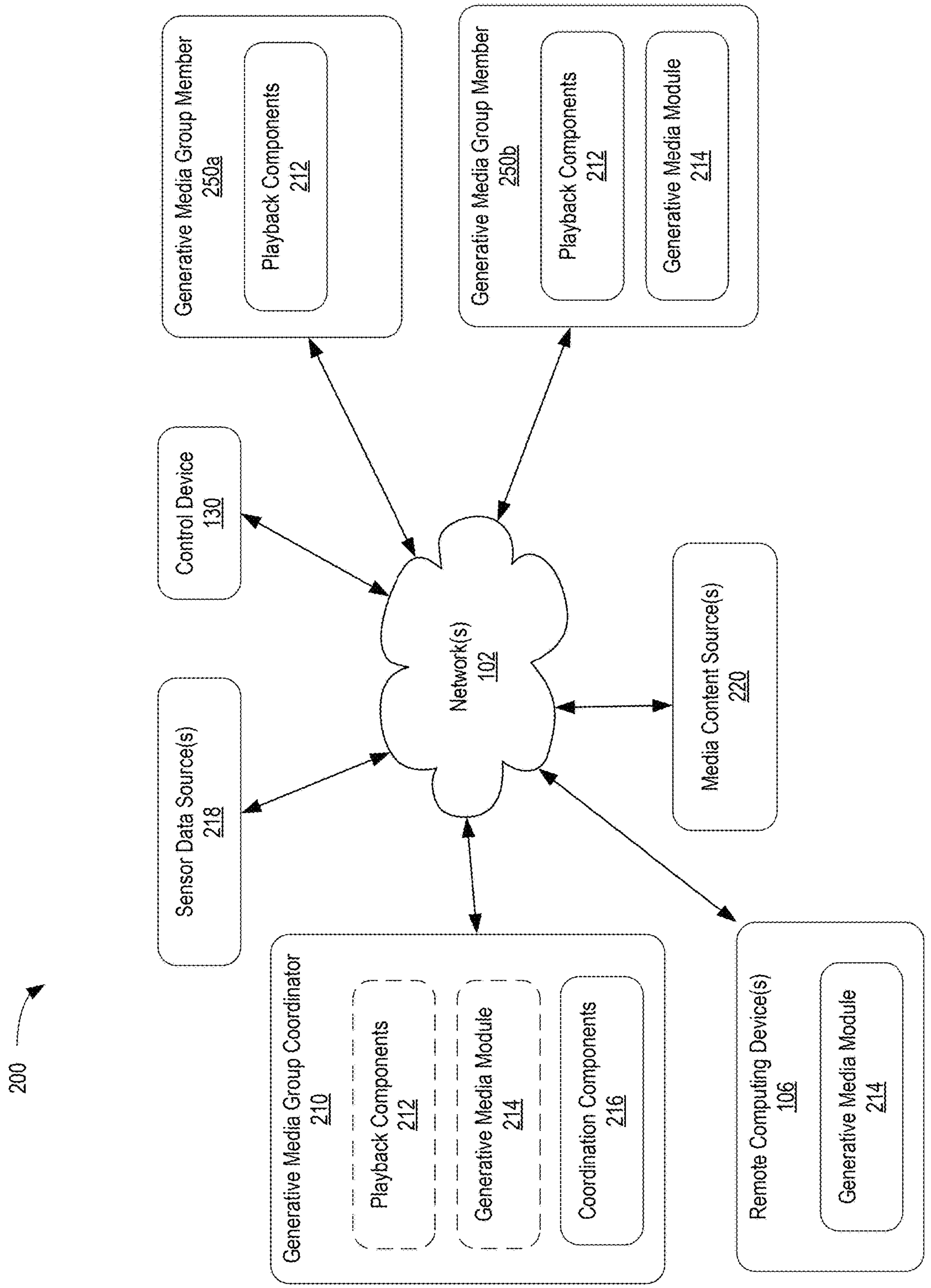
FIG. 2 is a functional block diagram of a system for playback of generative media content in accordance with examples of the present technology.

FIG. 2 is a functional block diagram of a system 200 for playback of generative media content. As noted previously, generative media content can include any media content (e.g., audio, video, audio-visual output, tactile output, or any other media content) that is dynamically created, synthesized, and/or modified by a non-human, rule-based process such as an algorithm or model. This creation or modification can occur for playback in real-time or near real-time. Additionally or alternatively, generative media content can be produced or modified asynchronously (e.g., ahead of time before playback is requested), and the particular item of generative media content may then be selected for playback at a later time. As used herein, a "generative media module" includes any system, whether implemented in software, a physical model, or combination thereof, that can produce generative media content based on one or more inputs. In some examples, such generative media content includes novel media content that can be created as wholly new or can be created by mixing, combining, manipulating, or otherwise modifying one or more pre-existing pieces of media content. As used herein, a "generative media content model" includes any algorithm, schema, or set of rules that can be used to produce novel generative media content using one or more inputs (e.g., sensor data, artist-provided parameters, media segments such as audio clips or samples, etc.). Among examples, a generative media module can use a variety of different generative media content models to produce different generative media content. In some instances, artists or other collaborators can interact with, author, and/or update generative media content models to produce particular generative media content. Although several examples throughout this discussion refer to audio content, the principles disclosed herein can be applied in some examples to other types of media content, e.g., video, audio-visual, tactile, or otherwise.

As shown in FIG. 2, the system 200 includes a generative media group coordinator 210, which is in communication with generative media group members 250*a* and 250*b*, as well as with sensor data source(s) 218, media content source(s) 220, and a control device 130. Such communication can be carried out via network(s) 102, which as noted above can include any suitable wired or wireless network connections or combinations thereof (e.g., WiFi network, a Bluetooth, a Z-Wave network, a ZigBee, an Ethernet connection, a Universal Serial Bus (USB) connection, etc.).

One or more remote computing device(s) 106 can also be in communication with the group coordinator 210 and/or group members 250*a* and 250*b* via the network(s) 102. In various examples, the remote computing device(s) 106 can be cloud-based servers associated with a device manufacturer, media content provider, voice-assistant service, or other suitable entity. As shown in FIG. 2, the remote computing device(s) 106 can include a generative media module 214. As described in more detail elsewhere herein, the remote computing device(s) 106 can produce generative media content remotely from the local devices (e.g., coordinator 210 and members 250*a* and 250*b*). The generative media content can then be transmitted to one or more of the local devices for playback. Additionally or alternatively, the generative media content can be produced wholly or in part via the local devices (e.g., group coordinator 210 and/or group members 250*a* and 250*b*). In some examples, the group coordinator 210 can itself be a remote computing device such that it is communicatively coupled to the group members 250*a* and 250*b* via a wide area network and the devices need not be co-located within the same environment (e.g., household, business location, etc.).

a. Example Generative Media Group Operation

In the illustrated example, a generative media group includes a generative media group coordinator 210 (also referred to herein as a "coordinator device 210") and first and second generative media group members 250*a* and 250*b* (also referred to herein as "first member device 250*a*," "second member device 250*b*," and, collectively, "member devices 250"). Optionally, one or more remote computing devices 106 can also form part of the generative media group. In operation, these devices can communicate with one another and/or with other components (e.g., sensor data source(s) 218, control device 130, media content source(s) 220, or any other suitable data sources or components) to facilitate the production and playback of generative media content.

In various examples, some or all of the devices 210 and/or 250 can be co-located within the same environment (e.g., within the same household, store, etc.). In some examples, at least some of the devices 210 and/or 250 can be remote from one another, for example within different households, different cities, etc.

The coordinator device 210 and/or the member devices 250 can include some or all of the components of the playback device 110 or network microphone device 120 described above with respect to FIGS. 1A-1H. For example, the coordinator device 210 and/or member devices 250 can optionally include playback components 212 (e.g., transducers, amplifiers, audio processing components, etc.), or such components can be omitted in some instances.

In some examples, the coordinator device 210 is a playback device itself, and as such may also operate as a member device 250. In other examples, the coordinator device 210 can be connected to one or more member devices 250 (e.g., via direct wired connection or via network 102) but the coordinator device 210 does not itself play back generative media content. In various examples, the coordinator device 210 can be implemented on a bridge-like device on a local network, on a playback device that is not itself part of the generative media group (i.e., the playback device does not itself play back the generative media content), and/or on a remote computing device (e.g., a cloud server).

In various examples, one or more of the devices can include a generative media module 214 thereon. Such generative media module(s) 214 can produce novel, synthetic media content based on one or more inputs, for example using a suitable generative media content model. As shown in FIG. 2, in some examples the coordinator device 210 can include a generative media module 214 for producing generative media content, which can then be transmitted to the member devices 250*a* and 250*b* for concurrent and/or synchronous playback. Additionally or alternatively, some or all of the member devices 250 (e.g., member device 250*b* as shown in FIG. 2) can include a generative media module 214, which can be used by the member device 250 to locally produce generative media content based on one or more inputs. In various examples, the generative media content can be produced via the remote computing device(s) 106, optionally using one or more input parameters received from local devices. This generative media content can then be transmitted to one or more of the local devices for coordination and/or playback.

In some examples, at least some of the member devices 250 do not include a generative media module 214 thereon. Alternatively, in some instances each member device 250 can include a generative media module 214 thereon, and can be configured to produce generative media content locally. In at least some examples, none of the member devices 250 include a generative media module 214 thereon. In such cases, generative media content can be produced by the coordinator device 210. Such generative media content can then be transmitted to the member devices 250 for concurrent and/or synchronous playback.

In the example shown in FIG. 2, the coordinator device 210 additionally includes coordination components 216. As described in more detail herein, in some instances the coordinator device 210 can facilitate playback of generative media content via multiple different playback devices (which may or may not include the coordinator device 210 itself). In operation, the coordination components 216 are configured to facilitate synchronization of both generative media creation (e.g., using one or more generative media modules 214, which may be distributed among the various devices) as well as generative media playback. For example, the coordinator device 210 can transmit timing data to the member devices 250 to facilitate synchronous playback. Additionally or alternatively, the coordinator device 210 can transmit inputs, generative media model parameters, or other data relating to the generative media module 214 to one or more member devices 250 such that the member devices 250 can produce generative media locally (e.g., using a locally stored generative media module 214), and/or such that the member devices 250 can update or modify the generative media modules 214 based on the inputs received from the coordinator device 210.

As described in more detail elsewhere herein, the generative media module(s) 214 can be configured to produce generative media based on one or more inputs using a generative media content model. The inputs can include sensor data (e.g., as provided by sensor data source(s) 218)), user input (e.g., as received from control device 130 or via direct user interaction with the coordinator device 210 or member devices 250), and/or media content source(s) 220. For example, a generative media module 214 can produce and continuously modify generative audio by adjusting various characteristics of the generative audio based on one or more input parameters (e.g., sensor data relating to one or more users relative to the devices 210, 250).

b. Example Media Content Source(s)

The media content source(s) 220 can include, in various examples, one or more local and/or remote media content sources. For example, the media content source(s) 220 can include one or more local audio sources 105 as described above (e.g., audio received over an input/output connection such as from a mobile device (e.g., a smartphone, a tablet, a laptop computer) or another suitable audio component (e.g., a television, a desktop computer, an amplifier, a phonograph, a Blu-ray player, a memory storing digital media files)). Additionally or alternatively, the media content source(s) 220 can include one or more remote computing devices accessible via a network interface (e.g., via communication over the network(s) 102). Such remote computing devices can include individual computers or servers, such as, for example, a media streaming service server storing audio and/or other media content, etc.

In various examples, the media available via the media content source(s) 220 can include pre-recorded audio segments in the form of complete sounds, songs, portions of songs (e.g., samples), or any audio component (e.g., pre-recorded audio of a particular instrument, synthetic beats or other audio segments, non-musical audio such as spoken word or nature sounds, etc.). In operation, such media can be utilized by the generative media modules 214 to produce generative media content, for example by combining, mixing, overlapping, manipulating, or otherwise modifying the retrieved media content to produce novel generative media content for playback via one or more devices. In some examples, the generative media content can take the form of a combination of pre-recorded audio segments (e.g., a pre-recorded song, spoken word recording, etc.) with novel, synthesized audio being created and overlaid with the pre-recorded audio. As used herein, "generative media content" or "generated media content" can include any such combination.

c. Example Generative Media Modules

As noted above, the generative media module 214 can include any system, whether instantiated in software, a physical model, or combination thereof, that can produce generative media content based on one or more inputs. In various examples, the generative media module 214 can utilize a generative media content model, which can include one or more algorithms or mathematical models that determine the manner in which media content is generated based on the relevant input parameters. In some instances, the algorithms and/or mathematical models can themselves be updated over time, for example based on instructions received from one or more remote computing devices (e.g., cloud servers associated with a music service or other entity), or based on inputs received from other group member devices within the same or a different environment, or any other suitable input. In some examples, various devices within the group can have different generative media modules 214 thereon—for example with a first member device having a different generative media module 214 than a second member device. In other cases, each device within the group that has a generative media module 214 can include substantially the same model or algorithm.

Any suitable algorithm or combination of algorithms can be used to produce generative media content. Examples of such algorithms include those using machine learning techniques (e.g., generative adversarial networks, neural networks, etc.), formal grammars, Markov models, finite-state automata, and/or any algorithms implemented within currently available offerings such as JukeBox by OpenAI, AWS DeepComposer by Amazon, Magenta by Google, AmperAI by Amper Music, etc. In various examples, the generative media module(s) 214 can utilize any suitable generative algorithms now existing or developed in the future.

In line with the discussion above, producing the generative media content (e.g., audio content) can involve changing various characteristics of the media content in real time and/or algorithmically generating novel media content in real-time or near real-time. In the context of audio content, this can be achieved by storing a number of audio samples in a database (e.g., within media content source(s) 220) that can be remotely located and accessible by the coordinator device 210 and/or the member devices 250 over the network(s) 102, or alternatively the audio samples can be locally maintained on the devices 210, 250 themselves. The audio samples can be associated with one or more metadata tags corresponding to one or more audio characteristics of the samples. For instance, a given sample can be associated with metadata tags indicating that the sample contains audio of a particular frequency or frequency range (e.g., bass/midrange/treble) or a particular instrument, genre, tempo, key, release date, geographical region, timbre, reverb, distortion, sonic texture, or any other audio characteristics that will be apparent.

In operation, the generative media modules 214 (e.g., of the coordinator device 210 and/or the second member device **250*b*) can retrieve certain audio samples based on their associated tags and mix the audio samples together to create the generative audio. The generative audio can evolve in real time as the generative media module(s) 214 retrieve audio samples with different tags and/or different audio samples with the same or similar tags. The audio samples that the generative media module(s) 214 retrieve can depend on one or more inputs, such as sensor data, time of day, geographic location, weather, or various user inputs, such as mood selection or physiological inputs such as heart rate or the like. In this manner, as the inputs change, so too does the generative audio. For example, if a user selects a calming or relaxation mood input, then the generative media module(s) 214 can retrieve and mix audio samples with tags corresponding to audio content that the user may find calming or relaxing. Examples of such audio samples might include audio samples tagged as low tempo or low harmonic complexity or audio samples that have been predetermined to be calming or relaxing and have been tagged as such. In some examples, the audio samples can be identified as calming or relaxing based on an automated process that analyzes the temporal and spectral content of the signals. Other examples are possible as well. In any of the examples herein, the generative media module(s) 214** can adjust the characteristics of the generative audio by retrieving and mixing audio samples associated with different metadata tags or other suitable identifiers.

Modifying characteristics of the generative audio can include manipulating one or more of: volume, balance, removing certain instruments or tones, altering a tempo, gain, reverb, spectral equalization, timbre, or sonic texture of the audio, etc. In some examples, the generative audio can be played back differently at different devices, for example emphasizing certain characteristics of the generative audio at the particular playback device that is nearest to the user. For instance, the nearest playback device can emphasize certain instruments, beats, tones, or other characteristics while the remaining playback devices can act as background audio sources.

As described elsewhere herein, the media content module(s) 214 can be configured to produce media intended to direct a user's mood and/or physiological state in a desired direction. In some examples the user's current state (e.g., mood, emotional state, activity level, etc.) is constantly and/or iteratively monitored or measured (e.g., at predetermined intervals) to ensure the user's current state is transitioning toward the desired state or at least not in a direction opposite the desired state. In such examples, the generative audio content can be varied to steer the user's current state towards the desired end state.

In any of the examples herein, the generative media module(s) can use hysteresis to avoid making rapid adjustments to the generative audio that could negatively impact the listening experience. For example, if the generative media module modifies the media based on an input of a user location relative to a playback device, when a user rapidly moves nearer to and farther from a playback device, the playback device could rapidly alter the generative audio in any of the manners described herein. Such rapid adjustments may be unpleasant to the user. In order to reduce these rapid adjustments, the generative media module 214 can be configured to employ hysteresis by delaying the adjustments to the generative audio for a predetermined period of time when the user's movement or other activity triggers an adjustment. For instance, if the playback device detects that the user has moved within the threshold distance of the playback device, then instead of immediately performing one of the adjustments described above, the playback device can wait a predetermined amount of time (e.g., a few seconds) before making the adjustment. If the user remains within the threshold distance after the predetermined amount of time, then the playback device can proceed to adjust the generative audio. If, however, the user does not remain within the threshold distance after the predetermined amount of time, then the generative media module(s) 214 can refrain from adjusting the generative audio. The generative media module(s) 214 can similarly apply hysteresis to the other generative media adjustments described herein.

Figure 3:
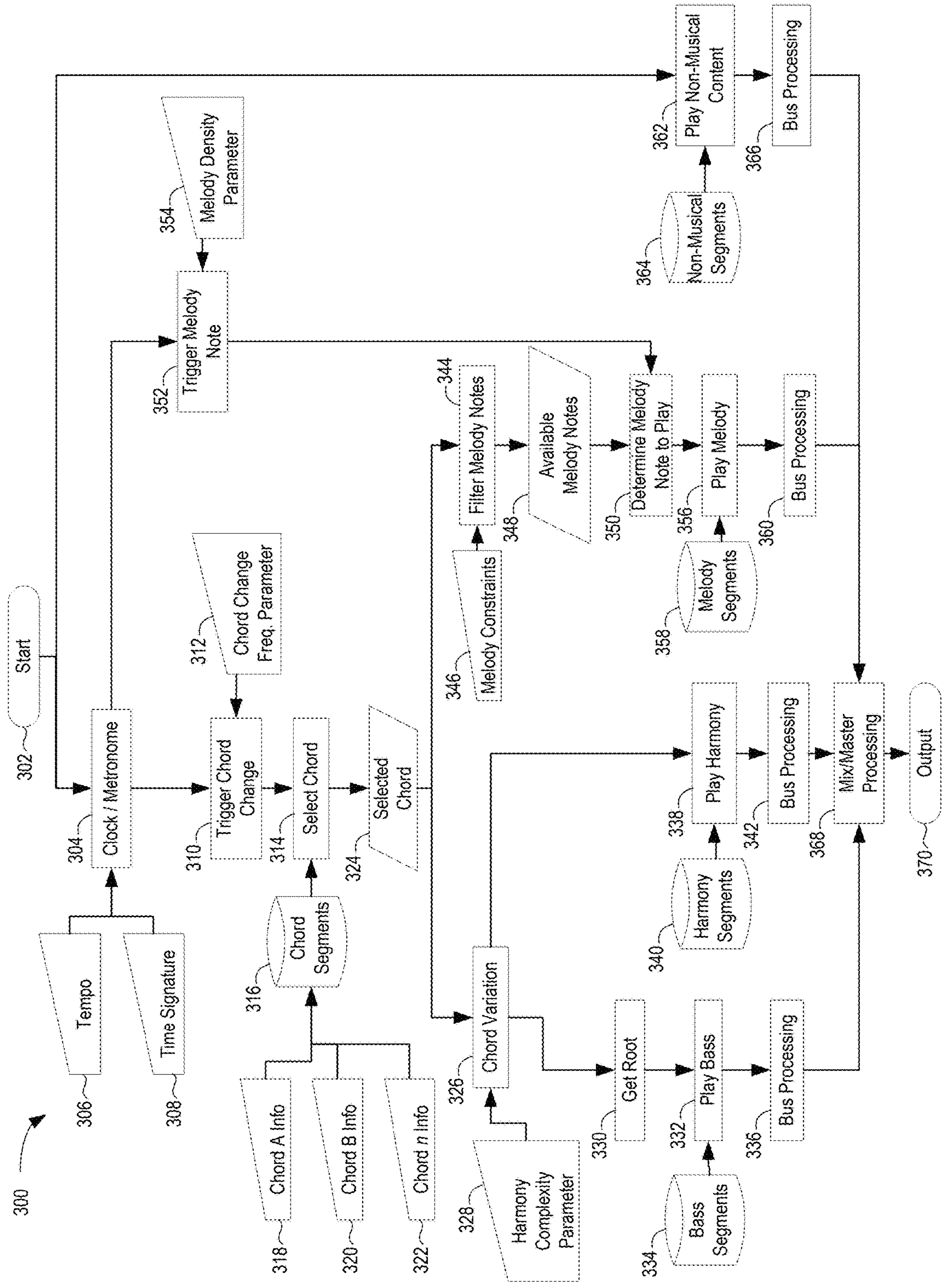
FIG. 3 is a functional block diagram for a generative media module in accordance with aspects of the present technology.

FIG. 3 illustrates a flow chart of a process 300 for producing generative audio content using a variety of input parameters. In various examples, one or more of these input parameters can be modified based on user input. For example, an artist may select the various parameters, constraints, or available audio segments shown in FIG. 2, and these selections may in turn determine, at least in part, the final output of generative audio content. As noted previously, such a generative media module may be stored and operated on one or more playback devices for local playback (e.g., via the same playback device and/or via other playback devices communicatively coupled over a local area network). Additionally or alternatively, such a generative media module may be stored and operated on one or more remote computing devices, with the resulting output transmitted over a wide area network to one or more remote devices for playback.

As illustrated, the process begins in block 302 and proceeds to the clock/metronome in block 304, at which the tempo 306 and time signature 308 inputs are received. The tempo 306 and time signature 308 can be selected by an artist or may be automatically determined or generated using a model. The process continues to block 310 at which a chord change can be triggered, and which receives a chord change frequency parameter 312 as an input. An artist may choose to have a higher chord change frequency in music intended for a higher energy experience (e.g., dance music, uplifting ambient music, etc.). Conversely, a lower chord change frequency may be associated with lower energy output (e.g., calming music).

At block 314, a chord is selected from the available chord segments 316. A plurality of chord information parameters 318, 320, 322 can also be provided as input to the chord segments 316. These inputs can be used to determine the particular chord to be played next and output as block 324. In some examples, the artist can provide information for each chord such as weightings, how often that particular chord should be used, etc.

Next, in block 326, a chord variation is selected, based at least in part on the harmony complexity parameter which serves as an input. The harmony complexity parameter 328 can be tuned or selected by an artist or may be determined automatically. In general, a higher harmony complexity parameter may be associated with higher energy audio output, and a lower harmony complexity parameter may be associated with lower energy audio output. In some cases, harmony complexity parameters can include inputs such as chord inversions, voicings, and harmony density.

In block 330, the process gets the root of the chord, and in block 332 selects the bass segment to play from among the available bass segments 334. These bass segments are then subject to bus processing 336, at which equalization, filtering, timing, and other processing can be performed.

Returning to the chord variation in block 326, the process separately continues to block 338 to play the harmony selected from among the available harmony segments 340. This harmony segment is then subject to bus processing 342. As with the bass bus processing, the harmony segment bus processing 342 can involve equalization, filtering, timing, and other processing can be performed.

Returning to the selected chord 324, the process separately continues to filter melody notes in block 344, which utilizes an input of melody constraints 346. The output in block 348 is the available melody notes to play. The melody constraints 346 can be provided by the artist, and may, for example, specify which notes to play or not to play, restrict the melody range, or provide other such constraints, which may depend on the particular selected chord 324.

In block 350, the process determines which melody note (from among the available melody notes 348) to play. This determination can be made automatically based on model values, artist-provided inputs, a randomization effect, or any other suitable input. In the illustrated example, one input is from the trigger melody note block 352, which in turn is based on the melody density parameter 354. The artist can provide the melody density parameter 354, which determines in part how complex and/or high-energy the audio output is. Based on that parameter, a melody note may be triggered more or less frequently and at particular times, using block 352 which is input to block 350 to determine which melody note to play. In various examples, the output of block 350 can be provided as an input to block 350 in the form of a feedback loop, such that the next melody note selected in block 350 depends at least in part on the last selected melody note in block 350. The melody segment is then selected in block 356 from among the available melody segments 358, and is then subject to bus processing 360.

Returning to the start in block 302, the process separately proceeds to block 362 to play non-musical content. This may be, for example, nature sounds, spoken-word audio, or other such non-musical content. Various non-musical segments 364 can be stored and available to be played. These non-musical content segments can also be subject to bus processing in block 366.

The outputs of these various paths (e.g., the selected bass segment(s), harmony segment(s), melody segment(s), and/or non-musical segment(s)) can each be subject to separate bus processing before being combined at block 368 via mixing and mastering processing. Here the combined levels can be set, various filters can be applied, relative timing can be established, and any other suitable processing steps performed before the generative audio content is output in block 370. In various examples, some of the paths may be omitted altogether. For example, the generative media module may omit the option of playing back non-musical content alongside the generative musical content. The process 300 shown in FIG. 3 is exemplary only, and one of skill in the art will appreciate that suitable modifications can be made the process 300 shown here, and additionally there are numerous suitable alternative processes that can be used for producing generative media content.

Figure 4:
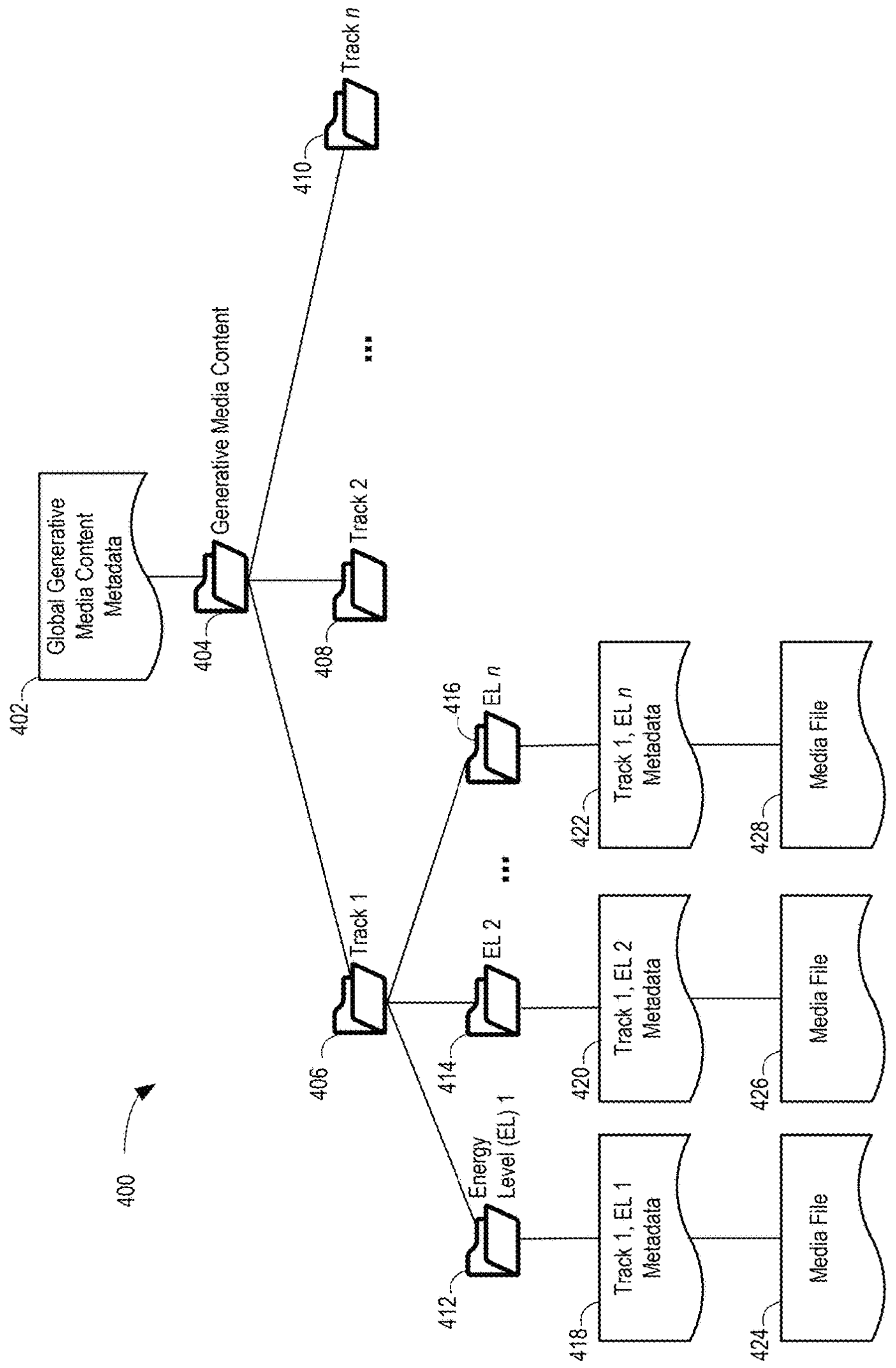
FIG. 4 is an example architecture for storing and retrieving generative media content in accordance with aspects of the present technology.

FIG. 4 is an example architecture for storing and retrieving generative media content. In this example, the generative media content includes a variety of discrete tracks (each having multiple variations associated with energy level or another parameter), which can be selected and played back in various orders and groupings depending on the particular input parameters.

As illustrated, the generative media content 404 can be stored as one or more audio files that are associated with global generative media content metadata 402. Such metadata can include, for example, the global tempo (e.g., beats per minute), global trigger frequency (e.g., how often to check for a change in input parameter(s)), and/or global crossfade duration (e.g., time to fade between the different selected energies).

Among the generative media content 404 are a plurality of different tracks 406, 408, and 410. In operation, these tracks can be selected and played back in various arrangements (e.g., randomized grouping with some overlay, or played back according to a predetermined sequence, etc.). In some examples, the generative media content 404 including the tracks 406, 408, 410 can be stored locally via one or more playback devices, while one or more remote computing devices can periodically transmit updated versions of the tracks, generative media content, and/or global generative media content metadata. In some examples, the remote computing devices can be polled or queried periodically by the playback device(s), and in response to the queries or polls, the remote computing devices can supply updates to the generative media module stored on the local playback device(s).

For each track, there may be corresponding subsets of that track corresponding to different energy levels. For example, a first energy level (EL) of track 1 at 412, a second energy level of track 1 at 414, and an n energy level of track 1 at 416. Each of these can include both metadata (e.g., metadata 418, 420, 422) and particular media files (e.g., media files 424, 426, 428) corresponding to the particular energy level. In some examples, each track may include a plurality of media files (e.g., media file 424) arranged in a particular manner, the arrangement and combination of which may be desired by the corresponding metadata (e.g., metadata 418). The media file can be, for example, in any suitable format that can be played back via the playback device and/or streamed to a playback device for playback. In some examples, one or more of the media files 424, 426, 428 can be outputs of the generative model depicted in FIG. 3. The metadata can include, for example, tempo (if different from global tempo), trigger frequency (if different from global trigger frequency), sequence information (e.g., whether to play particular files in order, randomly, or by percent weighting), crossfade duration (if different from global crossfade), spatial information (e.g., for rending audio content in space using multiple transducers), polyphony information (e.g., allowing multiple audio files to play at once in this segment), and/or level (e.g., level adjustment in dB, or random within a predefined range).

In operation, one or more input parameters (e.g., number of people present in a room, time of day, etc.) can be used to determine a target energy level. This determination can be made using a playback device and/or one or more remote computing devices. Based on this determination, particular media files can be selected that correspond to the determined energy level. The generative media module can then arrange and play back those selected tracks according to the generative content model. This can involve playing the selected tracks back in a particular pre-defined order, playing them back in a random or pseudo-random order, or any other suitable approach. The tracks can be played back in a manner that is at least partially overlapping in some examples. It can be useful to vary the amount of overlap between tracks such that casual listeners do not hear a repeating loop of audio content, but instead perceive the generative audio as an endless stream of audio without repetition.

Although the example shown in FIG. 4 utilizes energy level as a parameter to distinguish different generative audio content, in various examples the particular variations or permutations of generative audio content can vary along other dimensions (e.g., genre, time of day, associated user task, etc.).

d. Example Sensor Data Source(s) and Other Input Parameters

As noted previously, the generative media module(s) 214 can produce generative media based at least in part on input parameters that can include sensor data (e.g., as received from sensor data source(s) 214) and/or other suitable input parameters. With respect to sensor input parameters, the sensor data source(s) 214 can include data from any suitable sensor, wherever located with respect to the generative media group and whatever values are measured thereby. Examples of suitable sensor data includes physiological sensor data such as data obtained from biometric sensors, wearable sensors, etc. Such data can include physiological parameters like heart rate, breathing rate, blood pressure, brainwaves, activity levels, movement, body temperature, etc.

Suitable sensors include wearable sensors configured to worn or carried by a user, such as a headset, watch, mobile device, brain-machine interface (e.g., Neuralink), headphone, microphone, or other similar device. In some examples, the sensor can be a non-wearable sensor or fixed to a stationary structure. The sensor can provide the sensor data, which can include data corresponding to, for example, brain activity, voice, location, movement, heart rate, pulse, body temperature, and/or perspiration. In some examples, the sensor can correspond to a plurality of sensors. For example, as explained elsewhere herein, the sensor may correspond to a first sensor worn by a first user, a second sensor worn by a second user, and a third sensor not worn by a user (e.g., fixed to a stationary or structure). In such examples, the sensor data can correspond to a plurality of signals received from each of the first, second, and third sensors.

The sensor can be configured to obtain or generate information generally corresponding to a user's mood or emotional state. In one example, the sensor is a wearable brain sensing headband, which is one of many examples of the sensor described herein. Such a headband can include, for example, an electroencephalography (EEG) headband having a plurality of sensors thereon. In some examples, the headband can correspond to any of the Muse™ headbands (InteraXon; Toronto, Canada). The sensors can be positioned at varying locations around an inner surface of the headband, e.g., to correspond to different brain anatomy (e.g., the frontal, parietal, temporal, and sphenoid bones) of the user. As such. each of the sensors can receive different data from the user. Each of the sensors can correspond to individual channels that can be streamed from the headband to the system devices 210 and/or 250. Such sensor data can be used to detect a user's mood, for example by classifying the frequencies and intensities of various brainwaves or by performing other analyses. Additional details of using a brain-sensing headband for generative audio content can be found in commonly owned U.S. Application No. 62/706,544, filed Aug. 24, 2020, titled MOOD DETECTIONAND/OR INFLUENCE VIA AUDIO PLAYBACK DEVICES, which is hereby incorporated by reference in its entirety.

In some examples, the sensor data source(s) 218 include data obtained from networked device sensor data (e.g., Internet-of-Things (IoT) sensors such as networked lights, cameras, temperature sensors, thermostats, presence detectors, microphones, etc.). Additionally or alternatively, the sensor data source(s) 218 can include environmental sensors (e.g., measuring or indicating weather, temperature, time/day/week/month, etc.).

In some examples, the generative media module 214 can utilize input in the form of playback device capabilities (e.g., number and type of transducers, output power, other system architecture), device location (e.g., either location relative to other playback devices, relative to one or more users). Additional examples of creating and modifying generative audio as a result of user and device location are described in more detail in commonly owned U.S. Application No. 62/956,771, filed Jan. 3, 2020, titled GENERATIVE MUSIC BASED ON USER LOCATION, which is hereby incorporated by reference in its entirety. Additional inputs can include a device state of one or more devices within the group, such as a thermal state (e.g., if a particular device is in danger of overheating, the generative content can be modified to reduce temperature), battery level (e.g., bass output can be reduced in a portable playback device with low battery levels), and bonding state (e.g., whether a particular playback device is configured as part of a stereo pair, bonded with a sub, or as part of a home theatre arrangement, etc.). Any other suitable device characteristic or state may similarly be used as an input for production of generative media content.

Another example input parameter includes user presence—for example when a new user enters a space playing back generative audio, the user's presence can be detected (e.g., via proximity sensors, a beacon, etc.) and the generative audio can be modified as a response. This modification can be based on number of users (e.g., with ambient, meditative audio for 1 user, relaxing music for 2-4 users, and party or dance music for greater than 4 users present). The modification can also be based on the identity of the user(s) present (e.g., a user profile based on the user's characteristics, listening history, or other such indicia).

In one example, a user can wear a biometric device that can measure various biometric parameters, such as heart rate or blood pressure, of the user and report those parameters to the devices 210 and/or 250. The generative media modules 214 of these devices 210 and/or 250 can use these parameters to further adapt the generative audio, such as by increasing the tempo of the music in response to detecting a high heart rate (as this may indicate that the user is engaging in a high motion activity) or decreasing the tempo of the music in response to detecting a high blood pressure (as this may indicate that the user is stressed and could benefit from calming music).

In yet another example, one or more microphones of a playback device (e.g., microphones 115 of FIG. 1F) can detect a user's voice. The captured voice data can then be processed to determine, for example, a user's mood, age, or gender, to identify a particular user from among several users within a household, or any other such input parameter. Other examples are possible as well.

e. Example Coordination Among Group Members

Figure 5:
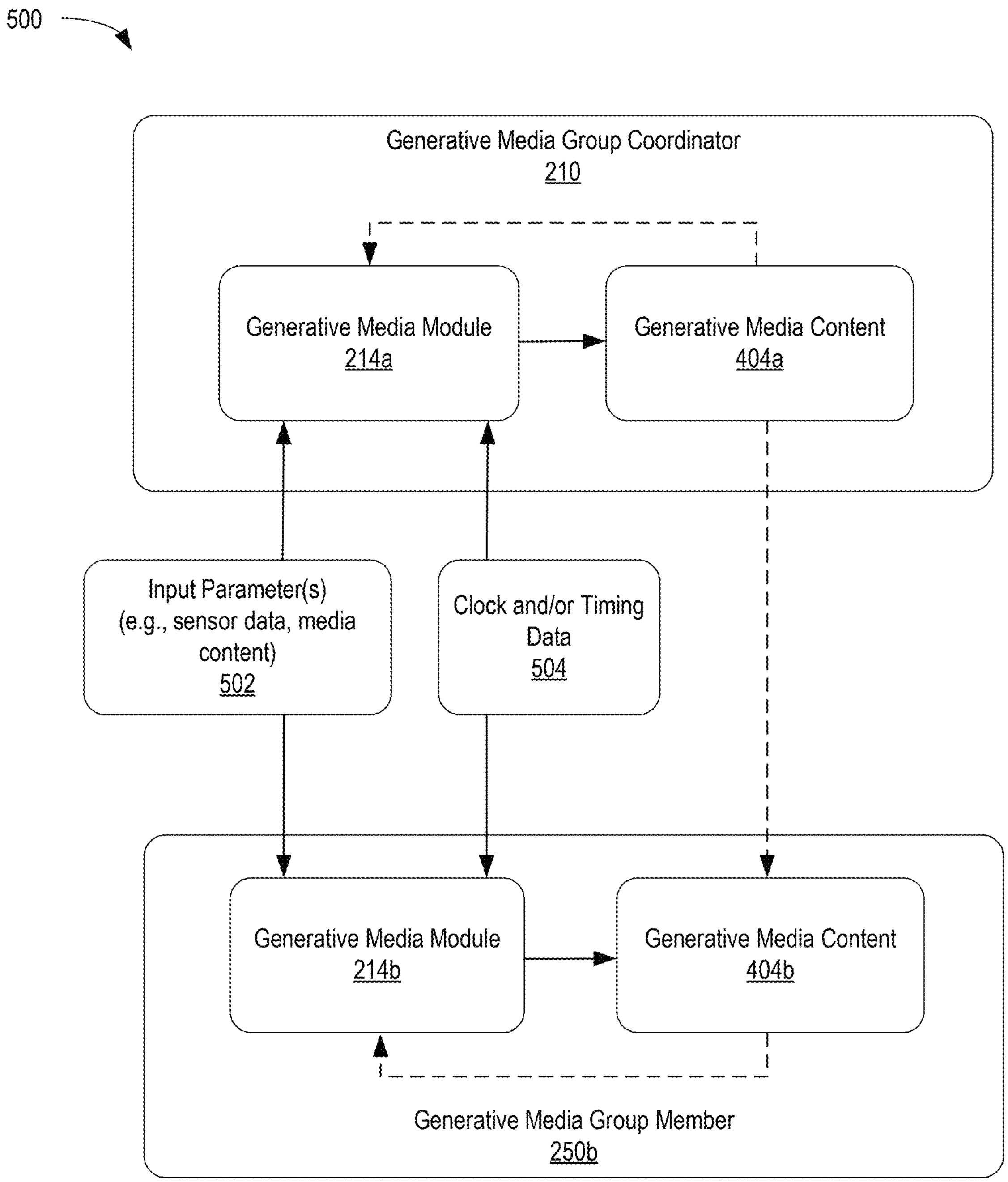
FIG. 5 is a functional block diagram illustrating data exchange in a system for playback of generative media content in accordance with aspects of the present technology.

FIG. 5 is a functional block diagram illustrating data exchange in a system for playback of generative media content. For purposes of explanation, the system 500 shown in FIG. 5 includes interactions between a coordinator device 210 and a member device 250*b*. However, the interactions and processes described herein can be applied to interactions involving a plurality of additional coordinator devices 210 and/or member devices 250. As shown in FIG. 5, the coordinator device 210 includes a generative media module 214*a* that receives inputs including input parameters 502 (e.g., sensor data, media content, model parameters for the generative media module 214*a*, or other such input) as well as clock and/or timing data 504. In various examples, the clock and/or timing data 504 can include synchronization signals to synchronize playback and/or to synchronize generative media being produced by various devices within the group. In some examples, the clock and/or timing data 504 can be provided by an internal clock, processor, or other such component housed within the coordinator device 210 itself. In some examples, the clock and/or timing data 504 can be received via a network interface from remote computing devices.

Based on these inputs, the generative media module 214*a* can output generative media content 404*a*. Optionally, the output generative media content 404*a* can itself serve as an input to the generative media module 214*a* in the form of a feedback loop. For example, the generative media module 214*a* can produce subsequent content (e.g., audio frames) using a model or algorithm that depends at least in part on the previously generated content.

In the illustrated example, the member device 250*b* likewise includes a generative media module 214*b*, which can be substantially the same as the generative media module 214*a* of the coordinator device 210, or may differ in one or more aspects. The generative media module 214*b* can likewise receive input parameter(s) 502 and clock and/or timing data 504. These inputs can be received from the coordinator device 210, from other member devices, from other devices on a local network (e.g., a locally networked smart thermostat supplying temperature data), and/or from one or more remote computing devices (e.g., a cloud server providing clock and/or timing data 504, or weather data, or any other such input). Based on these inputs, the generative media module 214*b* can output generative media content 404*b*. This produced generative media content 404*b* can optionally be fed back into the generative media module 214*b* as part of a feedback loop. In some examples, the generative media content 404*b* can include or consist of generative media content 404*a* (produced via the coordinator device 210) which has been transmitted over a network to the member device 250*b*. In other cases, the generative media content 404*b* can be produced independently and separately of the generative media content 404*a* produced via the coordinator device 210.

The generative media content 404*a* and 404*b* can then be played back, either via the devices 210 and 250*b* themselves, and/or as played back by other devices within the group. In various examples, the generative media content 404*a* and 404*b* can be configured to be played back concurrently and/or synchronously. In some instances, the generative media content 404*a* and 404*b* can be substantially identical or similar to one another, with each generative media module 214 utilizing the same or similar algorithms and the same or similar inputs. In other instances, the generative media content 404*a* and 404*b* can differ from one another while still being configured for synchronous or concurrent playback.

f. Example Generative Media Using Distributed Architectures

As noted previously, generation of media content can be computationally intensive, and in some cases may be impractical to perform wholly on local playback devices alone. In some examples, a generative media module of a local playback device can request generative media content from a generative media module stored on one or more remote computing devices (e.g., cloud servers). The request can include or be based on particular input parameters (e.g., sensor data, user inputs, contextual information, etc.). In response to the request, the remote generative media module can stream particular generative media content to the local device for playback. The particular generative media content provided to the local playback device can vary over time, with the variation depending on the particular input parameters, the configuration of the generative media module, or other such parameter. Additionally or alternatively, the playback device can store discrete tracks for playback (e.g., with different variations of tracks associated with different energy levels, as depicted in FIG. 4). The remote computing device(s) may then periodically provide new files for updated tracks to the local playback device for playback, or alternatively may provide an update to the generative media module that determines when and how to play back the particular files that are stored locally on the playback device.

In this manner, the tasks required to produce and play back generative audio are distributed among one or more remote computing device(s) and one or more local playback devices. By performing at least some of the computationally intensive tasks associated with generating novel media content to the remote computing devices, and optionally by reducing the need for real-time computation, overall efficiency can be improved. By generating, via remote computing devices, a discrete number of alternative tracks or track variation according to a particular media content model ahead of playback, the local playback device may request and receive particular variations based on real-time or near-real-time input parameters (e.g., sensor data). For example, the remote computing devices can generate different versions of the media content, and the playback device can request particular versions in real-time based on input parameters. The result is playback of suitable generative media content based on real-time or near-real-time input parameters (e.g., sensor data) without requiring de novo generation of such media content to be performed in real time.

Figure 6:
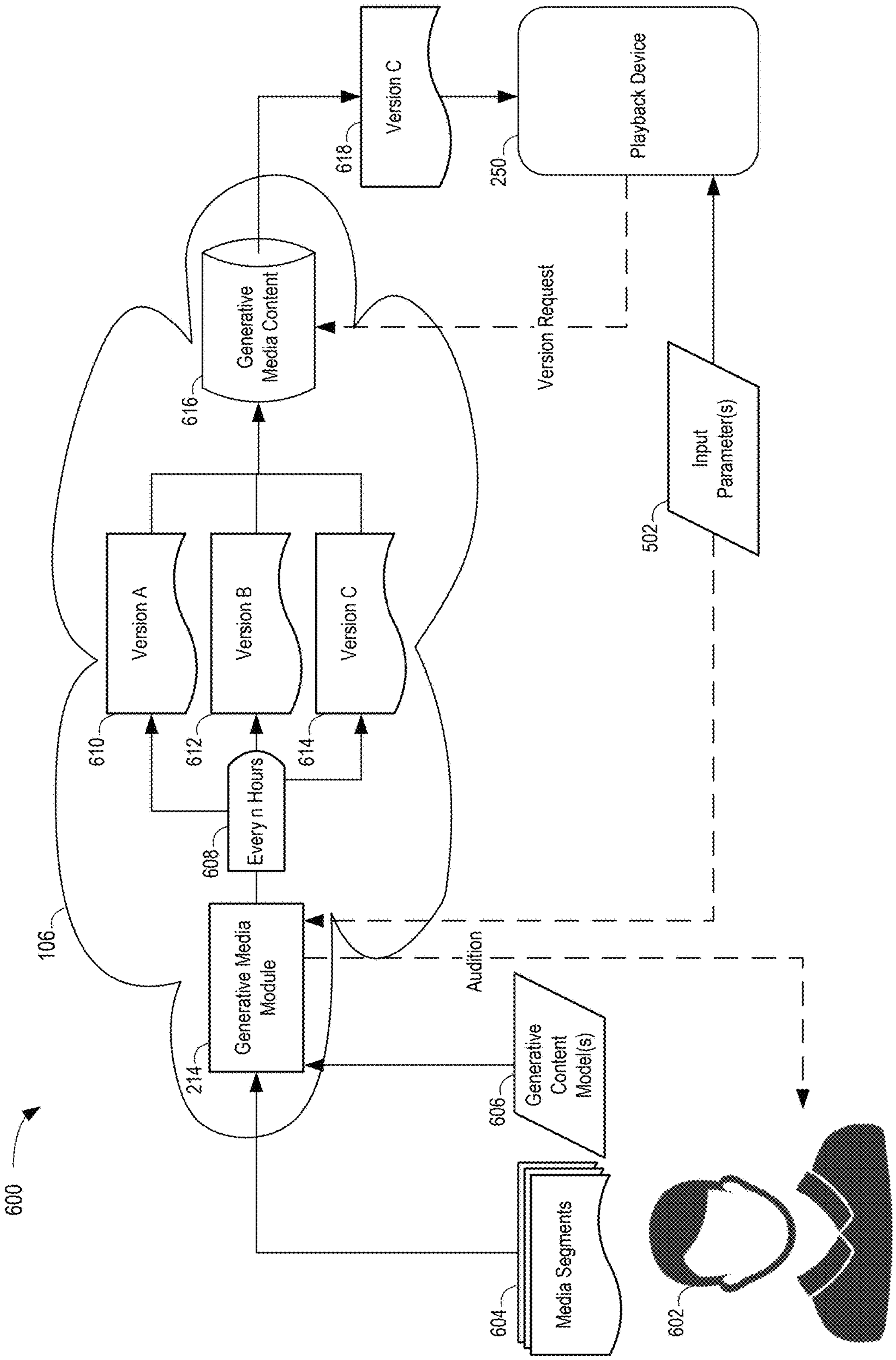
FIG. 6 is a schematic diagram of an example distributed generative media playback system in accordance with aspects of the present technology.

FIG. 6 is a schematic diagram of an example distributed generative media playback system 600. As illustrated, an artist 602 can supply a plurality of media segments 604 and one or more generative content models 606 to a generative media module 214 stored via one or more remote computing devices. The media segments can correspond to, for example, particular audio segments or seeds (e.g., individual notes or chords, short tracks of n bars, non-musical content, etc.). In some examples, the generative content models 606 can also be supplied by the artist 602. This can include providing the entire model, or the artist 602 may provide inputs to the model 606, for example by varying or tuning certain aspects (e.g., tempo, melody constraints, harmony complexity parameter, chord change density parameter, etc.).

The generative media module 214 can receive both the media segments 604 and one or more input parameters 502 (as described elsewhere herein). Based on these inputs, the generative media module 214 can output generative media. As shown in FIG. 6, the artist 602 can optionally audition the generative media module 214, for example by receiving exemplary outputs based on the inputs provided by the artist 602 (e.g., the media segments 604 and/or generative content model(s) 606). In some cases, the audition can play back to the artist 602 variations of the generative media content depending on a variety of different input parameters (e.g., with one version corresponding to a high energy level intended to produce an exciting or uplifting effect, another version corresponding to a low energy level intended to produce a calming effect, etc.). Based on the outputs via this audition step, the artist 602 may dynamically update the media segments 604 and/or settings of the generative content model(s) 606 until the desired outputs are achieved.

In the illustrated example, there can be an iteration at block 608 every n hours (or minutes, days, etc.) at which the generative media module 214 can produce a plurality of different versions of the generative media content. In the illustrated example, there are three versions: version A in block 610, version B in block 612, and version C in block 614. These outputs are then stored (e.g., via the remote computing device(s)) as generative media content 616. A particular one of the versions (version C as block 618 in this example) can be transmitted (e.g., streamed) to the local playback device 250 for playback. In some examples, the particular versions can correspond to the tracks 406, 408, and 410 shown in FIG. 4.

Although three versions are shown here by way of example, in practice there may be many more versions of generative media content produced via the remote computing devices. The versions can vary along a number of different dimensions, such as being suitable for different energy levels, suitable for different intended tasks or activities (e.g., studying versus dancing), suitable for different time of day, or any other appropriate variations.

In the illustrated example, the playback device 250 can periodically request a particular version of the generative media content from the remote computing device(s). Such requests can be based on, for example, user inputs (e.g., user selection via a controller device), sensor data (e.g., number of people present in a room, background noise levels, etc.), or other suitable input parameter. As illustrated, the input parameter(s) 502 can optionally be provided to (or detected by) the playback device 250. Additionally or alternatively, the input parameter(s) 502 can be provided to (or detected by) the remote computing device(s) 106. In some examples, the playback device 250 transmits the input parameters to the remote computing device(s) 106, which in turn provide a suitable version to the playback device 250, without the playback device 250 specifically requesting a particular version.

g. Example Methods for Generation and Playback of Generative Audio

FIGS. 7-10 are flow diagrams of example methods for playing back generative audio content via multiple discrete playback devices. The methods 700, 800, 900, 1000 can be implemented by any of the devices described herein, or any other devices now known or later developed.

Various examples of the methods 700, 800, 900, 1000 include one or more operations, functions, or actions illustrated by blocks. Although the blocks are illustrated in sequential order, these blocks may also be performed in parallel, and/or in a different order than the order disclosed and described herein. Also, the various blocks may be combined into fewer blocks, divided into additional blocks, and/or removed based upon a desired implementation.

In addition, for the methods 700, 800, 900, 1000 and for other processes and methods disclosed herein, the flowcharts show functionality and operation of possible implementations of some examples. In this regard, each block may represent a module, a segment, or a portion of program code, which includes one or more instructions executable by one or more processors for implementing specific logical functions or steps in the process. The program code may be stored on any type of computer readable medium, for example, such as a storage device including a disk or hard drive. The computer readable medium may include non-transitory computer readable media, for example, such as tangible, non-transitory computer-readable media that stores data for short periods of time like register memory, processor cache, and Random-Access Memory (RAM). The computer readable medium may also include non-transitory media, such as secondary or persistent long-term storage, like read only memory (ROM), optical or magnetic disks, compact disc read only memory (CD-ROM), for example. The computer readable media may also be any other volatile or non-volatile storage systems. The computer readable medium may be considered a computer readable storage medium, for example, or a tangible storage device. In addition, for the methods and for other processes and methods disclosed herein, each block in FIGS. 7-10 may represent circuitry that is wired to perform the specific logical functions in the process.

Figure 7:
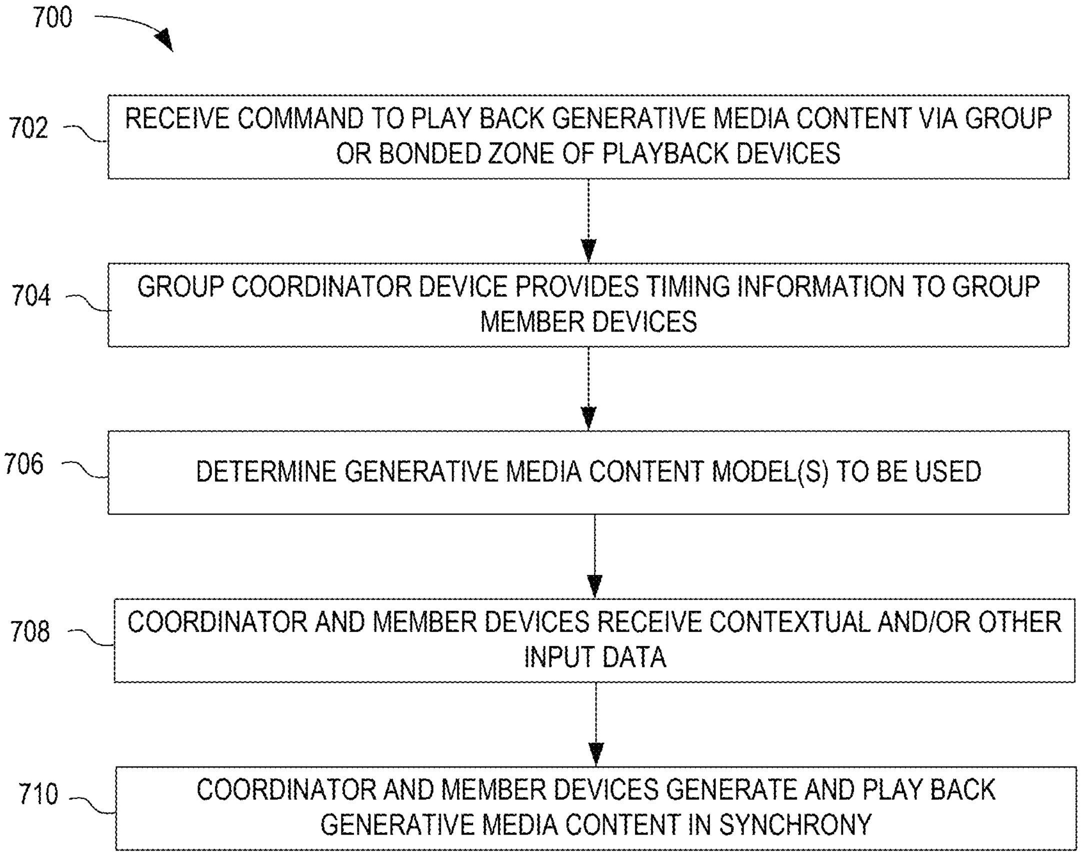
FIGS. 7-10 are flow diagrams of methods for playback of generative media content in accordance with aspects of the present technology.

With reference to FIG. 7, the method 700 begins at block 702, which involves receiving a command to play back generative media content via a group or bonded zone of playback devices. Such a command can be received via, for example a control device 130 or other suitable user input.

At block 704, the method 700 involves a group coordinator device providing timing information to generative group member devices. The timing information can include contextual timing data (e.g., time data associated with sensor input or other user input), generative media playback timing data (e.g., time stamps and synchronization data to facilitate synchronous playback of generative media), and/or media content stream timing data based on a common clock.

At block 706, the method optionally includes determining generative media content model(s) to be used to produce generative media. Such models can be implemented in, for example, the media content module(s) 214 described above with respect to FIGS. 2-6. In some examples, each of the member devices can utilize the same or substantially the same generative media content models, while in other cases some or all of the member devices can utilize generative media content models that differ from one another. For example, a first generative media content model can produce rhythmic beats, while a second generative media content model can produce ambient nature sounds. When played back concurrently, the generative audio produced by these different generative media content models can produce a pleasing listener experience for the users. In some examples, the selection of a particular generative media content model can itself be based on one more input parameters, such as device capabilities, device location, number of users present, user sensor data, etc.

In block 708, the method 700 includes the coordinator device and member device(s) receiving contextual and/or other input data. For example, the input data can include sensor data, user inputs, context data, or any other relevant data that can be utilized as an input for a generative media content model.

The method 700 continues in block 710 with the coordinator and member devices generating and playing back generative media content in synchrony.

Figure 8:
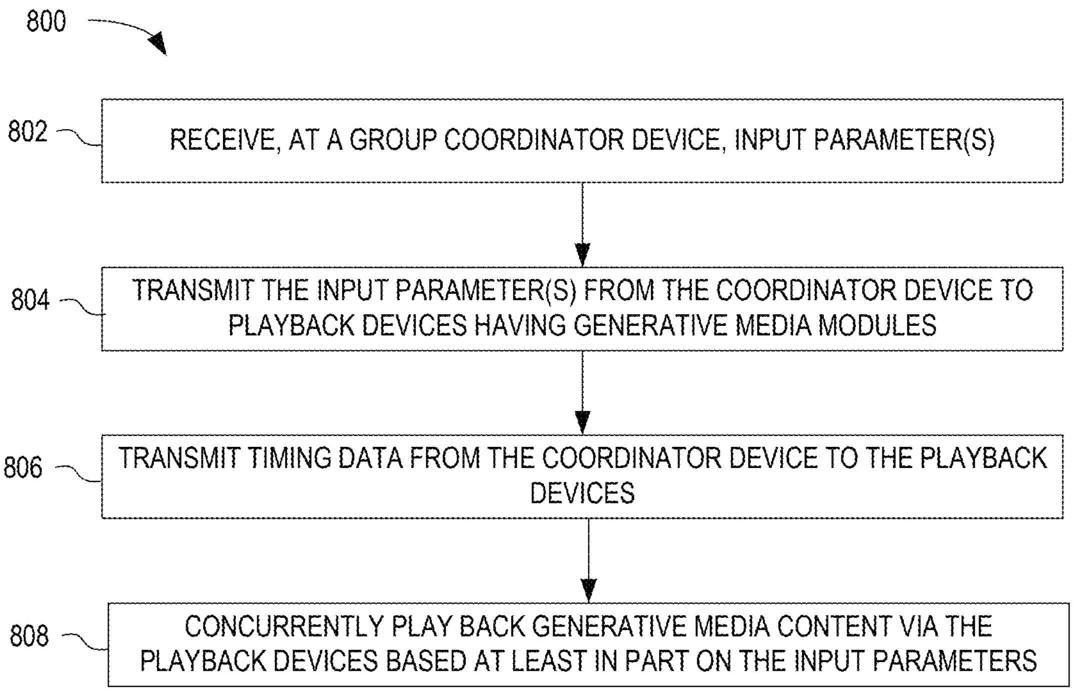
Figure 9:
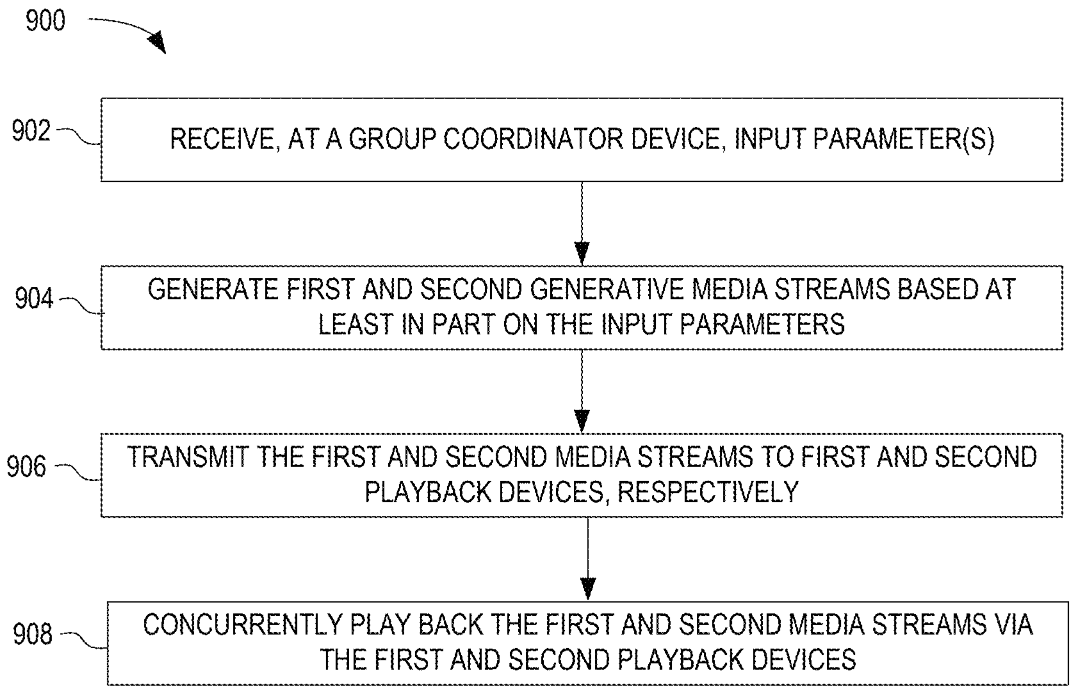

FIG. 8 illustrates another method 800 for playing back generative audio content via multiple playback devices. The method 800 begins in block 802 with receiving, at a group coordinator device, one or more input parameters. As noted previously, the input parameters can include sensor data, user input, contextual data, or any other input that can be used by a generative media module to produce generative audio for playback.

In block 804, the coordinator device transmits the input parameters to one or more discrete playback devices having generative media modules thereon. For example, the coordinator device can obtain sensor data and other input parameters and transmit these to a plurality of discrete playback devices within an environment or even distributed among multiple environments. In some examples, these input parameters can include features of the generative content model(s) themselves, for example providing instructions to update the generative media modules stored by locally by one or more of the discrete playback devices.

In block 806, the method involves transmitting timing data from the coordinator device to the playback devices. The timing data can include, for example clock data or other synchronization signals configured to facilitate coordination of the production of generative media content as well as synchronous playback of that generative media content via the discrete playback devices.

The method 800 continues in block 808 with concurrently playing back generative media content via the playback devices based at least in part on the input parameters. As discussed previously, the various playback devices may play back the same generative audio or each may play back distinct generative audio that, when played back synchronously, produces a desired psychoacoustic effect for the users present.

In the example of FIG. 8, the generative media content can be produced locally by discrete playback devices, which each play back creating their own generative audio content in parallel with one another. In an alternative method 900 shown in FIG. 9, the generative media content is produced at the coordinator device, which then transmits the generative media content along with timing data to the discrete playback devices for synchronous playback.

In block 902, the method 900 involves receiving, at a group coordinator device, one or more input parameters. Examples of the input parameters are described elsewhere herein, and include sensor data, user input, contextual data, or any other input that can be used by a generative media module to produce generative audio for playback.

In block 904, the coordinator device generates first and second generative media streams based at least in part on the input parameters, and in block 906 the first and second media streams are transmitted to first and second discrete playback devices, respectively. For example, the coordinator device can generate two streams that form different channels of generative audio, for example with a left channel to be played back by a first playback device and a corresponding right channel to be played back by a second playback device. Additionally or alternatively, the two streams can be distinct audio tracks that nonetheless can be played back synchronously, such as rhythmic beats in one stream and ambient nature sounds in the other stream. Multiple other variations are possible. Although this example describes two streams for two playback devices, in various other examples there may be one stream or more than two streams that can be provided to any number of playback devices for synchronous playback. In at least some examples, one or more of the playback devices can be positioned in different environments far apart from one another (e.g., in different households, different cities, etc.).

In block 908, the first playback device plays back the first generative media stream and the second playback device plays back the second generative media stream. In some examples, this concurrent playback can be facilitated by use of timing data received from the coordinator device.

Figure 10:
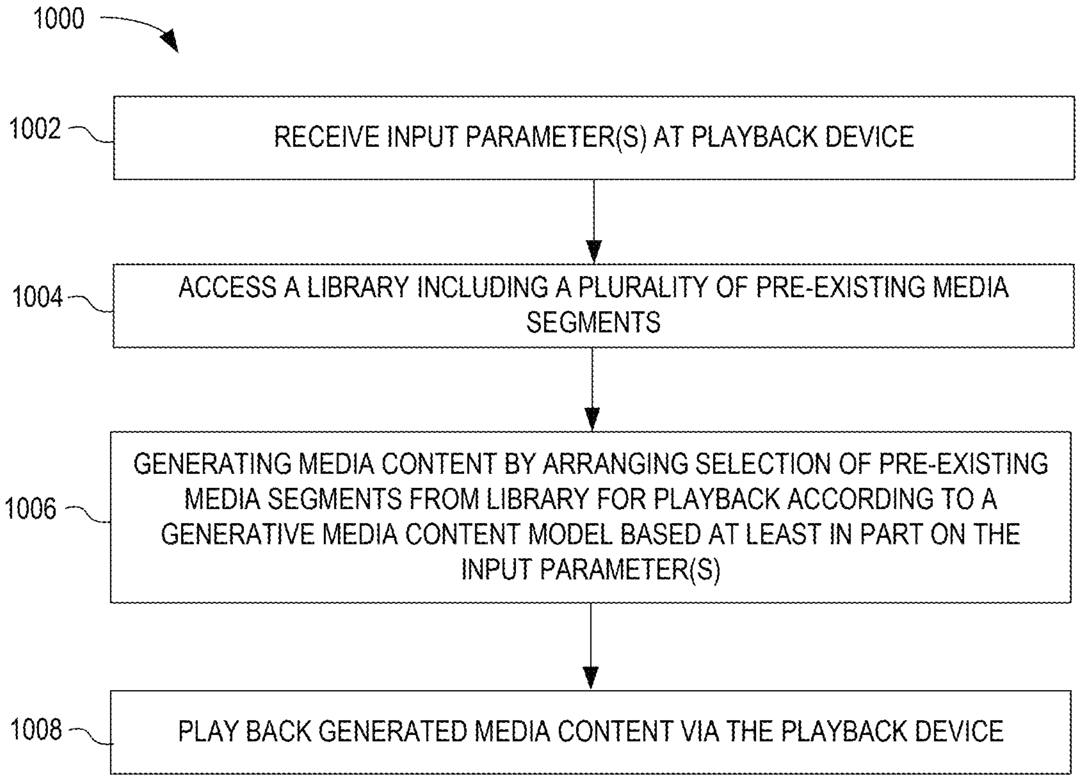

FIG. 10 illustrates another example method 1000 for generation and playback of generative media content. As described above, it can be beneficial to perform at least a portion of the processing required to produce generative media content using one or more remote computing devices (e.g., cloud-based servers) so as to reduce the computational demands placed on local playback devices and/or to perform operations that would not be feasible using the components of the local playback devices. The method 1000 begins in block 1002 with receiving, at a playback device, one or more input parameters. As noted previously, the input parameters can include sensor data, user input, contextual data, or any other input that can be used by a generative media module to produce generative audio for playback.

In block 1004, the method 1000 involves accessing a library that includes a plurality of pre-existing media segments. For example, a plurality of discrete media segments (e.g., audio tracks) can be stored on the playback device, and can be arranged and/or mixed for playback according to a generative content model. Additionally or alternatively, the library can be stored on one or more remote computing devices, with individual media segments being transmitted from the remote computing device(s) to the playback device for playback.

The method 1000 continues in block 1006 with generating media content by arranging a selection of the pre-existing media segments from the library for playback according to a generative media content model and based, at least in part, on the input parameters. As described elsewhere herein, a generative media content model can receive the one or more input parameters as an input. Based on the input, and using the generative media content model, particular generative media content can be output. Among examples, the generative media content can include an arrangement of the pre-existing media segments, for example arranging them in a particular order, with or without overlap between the particular media segments, and/or with additional processing or mixing steps performed to produce the desired output.

In block 1008, the playback device plays back the generated media content. In various examples, this playback can be performed concurrently and/or synchronously with additional playback devices.

Various examples of generative media playback are described herein. One of skill in the art will understand that a wide variety of different generative media modules, algorithms, inputs, sensor data, and playback device configurations are contemplated and may be used in accordance with the present technology.

IV. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "example" means that a particular feature, structure, or characteristic described in connection with the example can be included in at least one example or embodiment of an invention. The appearances of this phrase in various places in the specification are not necessarily all referring to the same example, nor are separate or alternative examples mutually exclusive of other examples. As such, the examples described herein, explicitly and implicitly understood by one skilled in the art, can be combined with other examples.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain examples of the present technology can be practiced without certain, specific details. In other instances, well known methods, procedures, components, and circuitry have not been described in detail to avoid unnecessarily obscuring aspects of the examples. Accordingly, the scope of the present disclosure is defined by the appended claims rather than the foregoing description of examples.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The disclosed technology is illustrated, for example, according to various examples described below. Various examples of examples of the disclosed technology are described as numbered examples (1, 2, 3, etc.) for convenience. These are provided as examples and do not limit the disclosed technology. It is noted that any of the dependent examples may be combined in any combination, and placed into a respective independent example. The other examples can be presented in a similar manner.

Example 1: A method comprising: receiving, at a coordinator device, input parameters; transmitting the input parameters from the coordinator device to a plurality of playback devices each having a generative media module therein; transmitting timing data, from the coordinator device to the plurality of playback devices, such that the playback devices concurrently play back generative media content based at least in part on the input parameters.

Example 2: The method of any one of the Examples herein, wherein first and second playback devices play back different generative audio content, each based at least in part on the input parameters.

Example 3: The method of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 4: The method of any one of the Examples herein, wherein the timing data comprises at least one of: clock data or one or more synchronization signals.

Example 5: The method of any one of the Examples herein, further comprising transmitting a signal from the coordinator device to at least one of the plurality of playback devices that causes the generative media module of the playback device to be modified.

Example 6: The method of any one of the Examples herein, wherein the generative media content comprises at least one of: generative audio content or generative visual content.

Example 7: The method of any one of the Examples herein, wherein the generative media modules comprise algorithms that automatically generate novel media output based on inputs that include at least the input parameters.

Example 8: A device comprising: a network interface; one or more processors; and a tangible, non-transitory computer-readable medium storing instructions that, when executed by the one or more processors, cause the device to perform operations comprising: receiving, via the network interface, input parameters; transmitting, via the network interface, the input parameters to a plurality of playback devices each having a generative media module therein; transmitting, via the network interface, timing data to the plurality of playback devices, such that the playback devices concurrently play back generative media content based at least in part on the input parameters.

Example 9: The device of any one of the Examples herein, wherein first and second playback devices play back different generative audio content, each based at least in part on the input parameters.

Example 10: The device of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 11: The device of any one of the Examples herein, wherein the timing data comprises at least one of: clock data or one or more synchronization signals.

Example 12: The device of any one of the Examples herein, wherein the operations further comprise transmitting, via the network interface, a signal from the coordinator device to at least one of the plurality of playback devices that causes the generative media module of the playback device to be modified.

Example 13: The device of any one of the Examples herein, wherein the generative media content comprises at least one of: generative audio content or generative visual content.

Example 14: The device of any one of the Examples herein, wherein the generative media modules comprise algorithms that automatically generate novel media output based on inputs that include at least the input parameters.

Example 15: A tangible, non-transitory computer-readable medium storing instructions that, when executed by one or more processors of a device cause the device to perform operations comprising: receiving, at a coordinator device, input parameters; transmitting the input parameters from the coordinator device to a plurality of playback devices each having a generative media module therein; transmitting timing data, from the coordinator device to the plurality of playback devices, such that the playback devices concurrently play back generative media content based at least in part on the input parameters.

Example 16: The computer-readable medium of any one of the Examples herein, wherein first and second playback devices play back different generative audio content, each based at least in part on the input parameters.

Example 17: The computer-readable medium of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 18: The computer-readable medium of any one of the Examples herein, wherein the timing data comprises at least one of: clock data or one or more synchronization signals.

Example 19: The computer-readable medium of any one of the Examples herein, further comprising transmitting a signal from the coordinator device to at least one of the plurality of playback devices that causes the generative media module of the playback device to be modified.

Example 20: The computer-readable medium of any one of the Examples herein, wherein the generative media content comprises at least one of: generative audio content or generative visual content.

Example 21: The computer-readable medium of any one of the Examples herein, wherein the generative media modules comprise algorithms that automatically generate novel media output based on inputs that include at least the input parameters.

Example 22: A method comprising: receiving, at a coordinator device, input parameters; generating, via a generative media module of the coordinator device, first and second media content streams; transmitting, via the coordinator device, the first media content stream to a first playback device; transmitting, via the coordinator device, the second media content stream to a second playback device such that the first and second media content streams are played back concurrently via the first and second playback devices.

Example 23: The method of any one of the Examples herein, further comprising transmitting timing data from the coordinator device to each of the first and second playback devices.

Example 24: The method of any one of the Examples herein, wherein the timing data comprises at least one of: clock data or one or more synchronization signals.

Example 25: The method of any one of the Examples herein, wherein the first and second media content streams differ.

Example 26: The method of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 27: The method of any one of the Examples herein, further comprising modifying the generative media module of the coordinator device.

Example 28: The method of any one of the Examples herein, wherein each of the first and second generative media content streams comprises at least one of: generative audio content or generative visual content.

Example 29: The method of any one of the Examples herein, wherein the generative media modules comprises an algorithm that automatically generates novel media output based on inputs that include at least the input parameters.

Example 30: A device comprising: a network interface; a generative media module; one or more processors; and tangible, non-transitory computer-readable media storing instructions that, when executed by the one or more processors, cause the device to perform operations comprising: receiving, via the network interface, input parameters; generating, via the generative media module, first and second media content streams; transmitting, via the network interface, the first media content stream to a first playback device; and transmitting, via the network interface, the second media content stream to a second playback device such that the first and second media content streams are played back concurrently via the first and second playback devices.

Example 31: The device of any one of the Examples herein, wherein the operations further comprise transmitting, via the network interface, timing data to each of the first and second playback devices.

Example 32: The device of any one of the Examples herein, wherein the timing data comprises at least one of: clock data or one or more synchronization signals.

Example 33: The device of any one of the Examples herein, wherein the first and second media content streams differ.

Example 34: The device of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 35: The device of any one of the Examples herein, wherein the operations further comprise modifying the generative media module.

Example 36: The device of any one of the Examples herein, wherein each of the first and second generative media content streams comprises at least one of: generative audio content or generative visual content.

Example 37: The device of any one of the Examples herein, wherein the generative media modules comprises an algorithm that automatically generates novel media output based on inputs that include at least the input parameters.

Example 38: A tangible, non-transitory computer-readable medium storing instructions that, when executed by one or more processors of a coordinator device, cause the coordinator device to perform operations comprising: receiving, at the coordinator device, input parameters; generating, via a generative media module of the coordinator device, first and second media content streams; transmitting, via the coordinator device, the first media content stream to a first playback device; and transmitting, via the coordinator device, the second media content stream to a second playback device such that the first and second media content streams are played back concurrently via the first and second playback devices.

Example 39: The computer-readable medium of any one of the Examples herein, further comprising transmitting timing data from the coordinator device to each of the first and second playback devices.

Example 40: The computer-readable medium of any one of the Examples herein, wherein the timing data comprises at least one of: clock data or one or more synchronization signals.

Example 41: The computer-readable medium of any one of the Examples herein, wherein the first and second media content streams differ.

Example 42: The computer-readable medium of any one of the Examples herein, wherein the input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity), user mood data).

Example 43: The computer-readable medium of any one of the Examples herein, wherein the operations further comprise modifying the generative media module of the coordinator device.

Example 44: The computer-readable medium of any one of the Examples herein, wherein each of the first and second generative media content streams comprises at least one of: generative audio content or generative visual content.

Example 45: The computer-readable medium of any one of the Examples herein, wherein the generative media modules comprises an algorithm that automatically generates novel media output based on inputs that include at least the input parameters.

Example 46: A playback device comprising: one or more amplifiers configured to drive one or more audio transducers; one or more processors; and data storage having instructions thereon that, when executed by the one or more processors, cause the playback device to perform operations comprising: receiving, at the playback device, one or more first input parameters; generating, via the playback device, first media content based at least in part on the one or more first input parameters, the generating comprising: accessing a library stored on the playback device including a plurality of pre-existing media segments; and arranging a first selection of pre-existing media segments from the library for playback according to a generative media content model and based at least in part on the one or more input parameters; and playing back, via the one or more amplifiers, the first generated media content.

Example 47: The playback device of any one of the Examples herein, wherein the operations further comprise: receiving, at the playback device, one or more second input parameters different from the first; generating, via the playback device, second media content based at least in part on the one or more second input parameters, the second media content different from the first, the generating comprising: accessing the library; and arranging a second selection of pre-existing media segments from the library for playback according to the generative media content model and based at least in part on the one or more second input parameters; and playing back, via the one or more amplifiers, the second generated media content.

Example 48: The playback device of claim 1, wherein arranging the first selection of pre-existing media segments from the library for playback comprises arranging two or more of the pre-existing media segments in an at least partially temporally offset manner.

Example 49: The playback device of any one of the Examples herein, wherein arranging the first selection of pre-existing media segments from the library for playback comprises arranging two or more of the pre-existing media segments in at least partially temporally overlapping manner.

Example 50: The playback device of any one of the Examples herein, wherein arranging the first selection of pre-existing media segments from the library for playback comprises applying different equalization adjustments to different pre-existing media segments.

Example 51: The playback device of any one of the Examples herein, wherein arranging the first selection of pre-existing media segments from the library or playback comprises applying varying gain levels over time to different pre-existing media segments.

Example 52: The playback device of any one of the Examples herein, wherein arranging the first selection of pre-existing media segments from the library or playback comprises randomizing a start point for playback of a particular pre-existing media segment.

Example 53: The playback device of any one of the Examples herein, wherein the first generated media content and the second generated media content each comprises novel media content.

Example 54: The playback device of any one of the Examples herein, wherein the first generated media content comprises audio content and the plurality of pre-existing media segments comprises a plurality of pre-existing audio segments.

Example 55: The playback device of any one of the Examples herein, wherein the first generated media content comprises audio-visual content and the plurality of pre-existing media segments comprises a plurality of pre-existing audio segments, pre-existing visual media segments, or pre-existing audio-visual media segments.

Example 56: The playback device of any one of the Examples herein, further comprising: receiving, via a network interface, additional pre-existing media segments; and updating the library to include at least the additional pre-existing media segments.

Example 57: The playback device of any one of the Examples herein, wherein the first and second input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity, voice utterance characteristics), user mood data).

Example 58: A method comprising: receiving, at a playback device, one or more first input parameters; generating, via the playback device, first media content based at least in part on the one or more first input parameters, the generating comprising: accessing a library stored on the playback device including a plurality of pre-existing media segments; and arranging a first selection of pre-existing media segments from the library for playback according to a generative media content model and based at least in part on the one or more input parameters; and playing back, via the playback device, the first generated media content.

Example 59: The method of any one of the Examples herein, further comprising: receiving, at the playback device, one or more second input parameters different from the first; generating, via the playback device, second media content based at least in part on the one or more second input parameters, the second media content different from the first, the generating comprising: accessing the library; and arranging a second selection of pre-existing media segments from the library for playback according to the generative media content model and based at least in part on the one or more second input parameters; and playing back, via the playback device, the second generated media content.

Example 60: The method of any one of the Examples herein, wherein arranging the first selection of pre-existing media segments from the library for playback comprises arranging two or more of the pre-existing media segments in an at least partially temporally offset manner.

Example 61: The method of any one of the Examples herein, wherein arranging the first selection of pre-existing media segments from the library for playback comprises arranging two or more of the pre-existing media segments in at least partially temporally overlapping manner.

Example 62: The method of any one of the Examples herein, wherein arranging the first selection of pre-existing media segments from the library for playback comprises applying different equalization adjustments to different pre-existing media segments.

Example 63: The method of any one of the Examples herein, wherein arranging the first selection of pre-existing media segments from the library or playback comprises applying varying gain levels over time to different pre-existing media segments.

Example 64: The method of any one of the Examples herein, wherein arranging the first selection of pre-existing media segments from the library or playback comprises randomizing a start point for playback of a particular pre-existing media segment.

Example 65: The method of any one of the Examples herein, wherein the first generated media content and the second generated media content each comprises novel media content.

Example 66: The method of any one of the Examples herein, wherein the first generated media content comprises audio content and the plurality of pre-existing media segments comprises a plurality of pre-existing audio segments.

Example 67: The method of any one of the Examples herein, wherein the first generated media content comprises audio-visual content and the plurality of pre-existing media segments comprises a plurality of pre-existing audio segments, pre-existing visual media segments, or pre-existing audio-visual media segments.

Example 68: The method of any one of the Examples herein, further comprising: receiving, via a network interface, additional pre-existing media segments; and updating the library to include at least the additional pre-existing media segments.

Example 69: The method of any one of the Examples herein, wherein the first and second input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity, voice utterance characteristics), user mood data).

Example 70: A tangible, non-transitory, computer-readable media storing instructions that, when executed by one or more processors of a playback device, cause the playback device to perform operations comprising: receiving, at the playback device, one or more first input parameters; generating, via the playback device, first media content based at least in part on the one or more first input parameters, the generating comprising: accessing a library stored on the playback device including a plurality of pre-existing media segments; and arranging a first selection of pre-existing media segments from the library for playback according to a generative media content model and based at least in part on the one or more input parameters; and playing back, via the playback device, the first generated media content.

Example 71: The computer-readable media of any one of the Examples herein, wherein the operations further comprise: receiving, at the playback device, one or more second input parameters different from the first; generating, via the playback device, second media content based at least in part on the one or more second input parameters, the second media content different from the first, the generating comprising: accessing the library; and arranging a second selection of pre-existing media segments from the library for playback according to the generative media content model and based at least in part on the one or more second input parameters; and playing back, via the one or more amplifiers, the second generated media content.

Example 72: The computer-readable media of any one of the Examples herein, wherein arranging the first selection of pre-existing media segments from the library for playback comprises arranging two or more of the pre-existing media segments in an at least partially temporally offset manner.

Example 73: The computer-readable media of any one of the Examples herein, wherein arranging the first selection of pre-existing media segments from the library for playback comprises arranging two or more of the pre-existing media segments in at least partially temporally overlapping manner.

Example 74: The computer-readable media of any one of the Examples herein, wherein arranging the first selection of pre-existing media segments from the library for playback comprises applying different equalization adjustments to different pre-existing media segments.

Example 75: The computer-readable media of any one of the Examples herein, wherein arranging the first selection of pre-existing media segments from the library or playback comprises applying varying gain levels over time to different pre-existing media segments.

Example 76: The computer-readable media of any one of the Examples herein, wherein arranging the first selection of pre-existing media segments from the library or playback comprises randomizing a start point for playback of a particular pre-existing media segment.

Example 77: The computer-readable media of any one of the Examples herein, wherein the first generated media content and the second generated media content each comprises novel media content.

Example 78: The computer-readable media of any one of the Examples herein, wherein the first generated media content comprises audio content and the plurality of pre-existing media segments comprises a plurality of pre-existing audio segments.

Example 79: The computer-readable media of any one of the Examples herein, wherein the first generated media content comprises audio-visual content and the plurality of pre-existing media segments comprises a plurality of pre-existing audio segments, pre-existing visual media segments, or pre-existing audio-visual media segments.

Example 80: The computer-readable media of any one of the Examples herein, further comprising: receiving, via a network interface, additional pre-existing media segments; and updating the library to include at least the additional pre-existing media segments.

Example 81: The computer-readable media of any one of the Examples herein, wherein the first and second input parameters comprise one or more of: physiological sensor data (e.g., biometric sensors, wearable sensors (heart rate, temperature, breathing rate, brainwave)); networked device sensor data (e.g., cameras, lights, temperature sensors, thermostats, presence detectors, microphones); environmental data (e.g., weather, temperature, time/day/week/month); playback device capability data (e.g., number and type of transducers, output power); playback device state (e.g., device temperature, battery level, current audio playback, playback device location, whether playback device is bonded with another playback device); or user data (e.g., user identity, number of users present, user location, user history data, user preference data, user biometric data (heart rate, temperature, breathing rate, brain activity, voice utterance characteristics), user mood data).

Example 82: A system, comprising a first playback device and a second playback device. The first playback device comprises: a first network interface; one or more first processors; and data storage having instructions thereon that, when executed by the one or more processors, cause the first playback device to perform operations comprising: receiving one or more input parameters; generating media content based at least in part on the one or more input parameters, the generated media content comprising a first portion and at least a second portion, the generating comprising: accessing a library stored on the playback device including a plurality of pre-existing media segments; and arranging a selection of pre-existing media segments from the library for playback according to a generative media content model and based at least in part on the one or more input parameters; transmitting, via the first network interface, a signal comprising the second portion of the generated media content and corresponding timing information; and causing playback of the first portion of the generated media content. The second playback device comprises: a second network interface; one or more audio transducers; one or more second processors; and data storage having instructions thereon that, when executed by the one or more second processors, cause the second playback device to perform operations comprising: receiving, via the second network interface, the transmitted signal from the first playback device; and playing back, via the one or more transducers, the second portion of the generated media content according to the timing information in substantial synchrony with playback of the first portion of the generated media content.

Example 83: The system of any one of the Examples herein, further comprising: a network device, comprising: a third network interface; one or more processors; and data storage having instructions thereon that, when executed by the one or more processors, cause the third playback device to perform operations comprising: receiving, via the third network interface a data network, a request from the first playback device; and in response to receiving the request, transmitting, via the third network interface over the data network, an updated library of pre-existing media segments to the first playback device.

Example 84: The system of any one of the Examples herein, wherein the network device comprises one or more of: a remote server, another playback device, a mobile computing device, a laptop, or a tablet.

Example 85: A system comprises a first playback device a second playback device communicatively coupled over a local area network. The first playback device comprises: one or more first processors; one or more first audio transducers; and data storage having instructions thereon that, when executed by the one or more first processors, cause the first playback device to perform operations comprising: receiving one or more input parameters; generating first media content based at least in part on the one or more input parameters, the generating comprising: accessing a first library stored on the first playback device including a plurality of pre-existing media segments; and arranging a selection of pre-existing media segments from the first library for playback according to a first generative media content model and based at least in part on the one or more input parameters; and playing back, via the one or more first audio transducers, the first generative media content. The second playback device comprises: a second network interface; one or more second audio transducers; one or more second processors; and data storage having instructions thereon that, when executed by the one or more second processors, cause the second playback device to perform operations comprising: generating second media content based at least in part on the one or more input parameters, the second generated media content being substantially identical to the first generated media content, the generating comprising: accessing a second library stored on the second playback device including a plurality of pre-existing media segments; and arranging a selection of pre-existing media segments from the second library for playback according to a second generative media content model and based at least in part on the one or more input parameters; and playing back, via the one or more second audio transducers, the second generated media content in synchrony with playback of the first generated media content via the first playback device.

Example 86: The system of any one of the Examples herein, wherein the first generative media content model and the second generative media content model are substantially identical.

Example 87: The system of any one of the Examples herein, wherein the first library and the second library are substantially identical.

The invention claimed is:

1. A first network device comprising:
- a network interface;
- one or more processors; and
- memory storing instructions that, when executed by the one or more processors, cause the first network device to perform operations comprising:
  - receiving an input parameter,
  - determining, via a generative AI model, that a task associated with the received input parameter exceeds a computational capacity of the first network device,
  - transmitting, via the network interface, a request to one or more second network devices to perform an action associated with the task,
  - receiving, via the network interface, a response from at least one of the one or more second network devices, wherein the response corresponds to an action performed by the at least one of the one or more second network devices, and
  - causing a set of one or more outputs associated with the received response,
  - wherein causing the set of one or more outputs associated with the received response comprises causing synchronous playback of output via a first playback device and a second playback device, and
  - wherein the first playback device plays audio content and wherein the second playback device plays video content.

2. The first network device of claim 1, further comprising one or more audio transducers, wherein causing the set of one or more outputs associated with the received response comprises causing, via the one or more audio transducers, playback of audio content associated with the received response.

3. The first network device of claim 1, further comprising a display, wherein causing the set of one or more outputs associated with the received response comprises causing a visual output via the display.

4. The first network device of claim 1, further comprising a first generative AI model stored on the first network device, wherein the set of one or more outputs associated with the received response comprises output generated by the first generative AI model stored on the first network device and output generated by a second generative AI model stored on at least one of the one or more second network devices.

5. The first network device of claim 4, wherein generating the set of one or more outputs associated with the received response comprises (i) generating, via the first generative AI model stored on the first network device, a first type of media content and (ii) generating, via the second generative AI model stored on at least one of the one or more second network devices, a second type of media content.

6. The first network device of claim 1, wherein the input parameter corresponds to a voice command or query.

7. The first network device of claim 1, wherein the computational capacity comprises at least one of processing capacity or memory capacity.

8. The first network device of claim 1, wherein at least one of the one or more second network devices is a remote computing device.

9. The first network device of claim 1, wherein the generative AI model is a first generative AI model, and wherein transmitting the request to the one or more second network devices to perform the action associated with the task comprises a request to have one or more second generative AI models stored on the one or more second network devices perform the action associated with the task.

10. The first network device of claim 9, wherein the first generative AI model is within the computational capacity of the first network device and the one or more second generative AI models exceed the computational capacity of the first network device.

11. A first network device comprising:

a network interface;

one or more processors;

one or more audio transducers; and memory storing instructions that, when executed by the one or more processors, cause the first network device to perform operations comprising:

receiving an input parameter, determining, via a generative AI model, that a task associated with the received input parameter exceeds a computational capacity of the first network device, transmitting, via the network interface, a request to one or more second network devices to perform an action associated with the task, receiving, via the network interface, a response from at least one of the one or more second network devices, wherein the response corresponds to an action performed by the at least one of the one or more second network devices, and causing a set of one or more outputs associated with the received response, wherein causing the set of one or more outputs associated with the received response comprises causing, via the one or more audio transducers, playback of audio content associated with the received response, and wherein the first network device is a first playback device, wherein the set of one or more outputs associated with the received response played back via the one or more audio transducers comprises a first portion of the audio content, and wherein causing the set of one or more outputs associated with the received response comprises causing, via the network interface, playback of a second portion of the audio content via a second playback device in synchrony with playback, via the one or more audio transducers, of the first portion of the audio content.

12. The first network device of claim 11, wherein the first playback device and the second playback device play back different portions of content.

13. The first network device of claim 11, wherein causing the set of one or more outputs associated with the received response comprises causing synchronous playback of output via the first playback device and the second playback device.

14. The first network device of claim 11, further comprising a first generative AI model stored on the first network device, wherein the set of one or more outputs associated with the received response comprises output generated by the first generative AI model stored on the first network device and output generated by a second generative AI model stored on at least one of the one or more second network devices.

15. The first network device of claim 14, wherein generating the set of one or more outputs associated with the received response comprises (i) generating, via the first generative AI model stored on the first network device, a first type of media content and (ii) generating, via the second generative AI model stored on at least one of the one or more second network devices, a second type of media content.

16. The first network device of claim 11, wherein the generative AI model is a first generative AI model, and wherein transmitting the request to the one or more second network devices to perform the action associated with the task comprises a request to have one or more second generative AI models stored on the one or more second network devices perform the action associated with the task.

17. The first network device of claim 16, wherein the first generative AI model is within the computational capacity of the first network device and the one or more second generative AI models exceed the computational capacity of the first network device.

18. A first network device comprising:

a network interface;

one or more processors, and memory storing instructions that, when executed by the one or more processors, cause the first network device to perform operations comprising;

receiving an input parameter, determining, via a generative AI model, that a task associated with the received input parameter exceeds a computational capacity of the first network device, transmitting, via the network interface, a request to one or more second network devices to perform an action associated with the task, receiving, via the network interface, a response from at least one of the one or more second network devices, wherein the response corresponds to an action performed by the at least one of the one or more second network devices, and causing a set of one or more outputs associated with the received response, wherein causing the set of one or more outputs associated with the received response comprises causing synchronous playback of output via a first playback device and a second playback device, wherein the second playback device comprises one of the one or more second network devices.

19. The first network device of claim 18, wherein the first playback device plays audio content and wherein the second playback device plays video content.

20. The first network device of claim 18, further comprising a first generative AI model stored on the first network device, wherein the set of one or more outputs associated with the received response comprises output generated by the first generative AI model stored on the first network device and output generated by a second generative AI model stored on at least one of the one or more second network devices.

21. The first network device of claim 20, wherein generating the set of one or more outputs associated with the received response comprises (i) generating, via the first generative AI model stored on the first network device, a first type of media content and (ii) generating, via the second generative AI model stored on at least one of the one or more second network devices, a second type of media content.

22. The first network device of claim 18, wherein the generative AI model is a first generative AI model, and wherein transmitting the request to the one or more second network devices to perform the action associated with the task comprises a request to have one or more second generative AI models stored on the one or more second network devices perform the action associated with the task.

23. The first network device of claim 22, wherein the first generative AI model is within the computational capacity of the first network device and the one or more second generative AI models exceed the computational capacity of the first network device.

24. A method, performed by a first network device comprising a network interface and one or more processors, the method comprising:

receiving an input parameter;

determining, via a generative AI model, that a task associated with the received input parameter exceeds a computational capacity of the first network device;

transmitting, via the network interface, a request to one or more second network devices to perform an action associated with the task;

receiving, via the network interface, a response from at least one of the one or more second network devices, wherein the response corresponds to an action performed by the at least one of the one or more second network devices; and causing a set of one or more outputs associated with the received response, wherein causing the set of one or more outputs associated with the received response comprises causing synchronous playback of output via a first playback device and a second playback device, and wherein the first playback device plays audio content and wherein the second playback device plays video content.

25. The method of claim 24, wherein causing the set of one or more outputs associated with the received response comprises causing, via one or more audio transducers, playback of audio content associated with the received response.

26. The method of claim 25, wherein the first network device is the first playback device, wherein the set of one or more outputs associated with the received response played back via the one or more audio transducers comprises a first portion of the audio content, and wherein causing the set of one or more outputs associated with the received response comprises causing, via the network interface, playback of a second portion of the audio content via the second playback device in synchrony with playback, via the one or more audio transducers, of the first portion of the audio content.

27. The method of claim 24, wherein the second playback device comprises one of the one or more second network devices.

28. The method of claim 24, wherein causing the set of one or more outputs associated with the received response comprises causing a visual output via a display.

29. The method of claim 24, wherein the set of one or more outputs associated with the received response comprises output generated by a first generative AI model stored on the first network device and output generated by a second generative AI model stored on at least one of the one or more second network devices.

30. The method of claim 29, wherein generating the set of one or more outputs associated with the received response comprises (i) generating, via the first generative AI model stored on the first network device, a first type of media content and (ii) generating, via the second generative AI model stored on at least one of the one or more second network devices, a second type of media content.

31. The method of claim 24, wherein the computational capacity comprises at least one of processing capacity or memory capacity.

32. A non-transitory computer-readable medium storing instructions that, when executed by a first network device comprising a network interface and one or more processors, cause the first network device to perform operations comprising:

receiving an input parameter;

determining, via a generative AI model, that a task associated with the received input parameter exceeds a computational capacity of the first network device;

transmitting, via the network interface, a request to one or more second network devices to perform an action associated with the task;

receiving, via the network interface, a response from at least one of the one or more second network devices, wherein the response corresponds to an action performed by the at least one of the one or more second network devices; and causing a set of one or more outputs associated with the received response, wherein causing the set of one or more outputs associated with the received response comprises causing synchronous playback of output via a first playback device and a second playback device, and wherein the first playback device plays audio content and wherein the second playback device plays video content.

33. The non-transitory computer-readable medium of claim 32, wherein causing the set of one or more outputs associated with the received response comprises causing, via one or more audio transducers, playback of audio content associated with the received response.

34. The non-transitory computer-readable medium of claim 33, wherein the first network device is the first playback device, wherein the set of one or more outputs associated with the received response played back via the one or more audio transducers comprises a first portion of the audio content, and wherein causing the set of one or more outputs associated with the received response comprises causing, via the network interface, playback of a second portion of the audio content via the second playback device in synchrony with playback, via the one or more audio transducers, of the first portion of the audio content.

35. The non-transitory computer-readable medium of claim 32, wherein the computational capacity comprises at least one of processing capacity or memory capacity.

* * * * *